(12) United States Patent
Kim et al.

(10) Patent No.: US 10,950,817 B2
(45) Date of Patent: Mar. 16, 2021

(54) LIGHTING APPARATUS USING ORGANIC LIGHT EMITTING DIODE HAVING CONDUCTIVE LAYER WITH HIGH RESISTANCE ON SUBSTRATE

(71) Applicant: LG Display Co., Ltd., Seoul (KR)

(72) Inventors: JongMin Kim, Seoul (KR); Jungeun Lee, Seoul (KR); Youngkyun Moon, Seoul (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 16/516,591

(22) Filed: Jul. 19, 2019

(65) Prior Publication Data

US 2020/0028110 A1    Jan. 23, 2020

(30) Foreign Application Priority Data

Jul. 23, 2018  (KR) .................. 10-2018-0085280

(51) Int. Cl.
*H01L 51/52* (2006.01)
*H01L 51/56* (2006.01)
*H01L 51/50* (2006.01)

(52) U.S. Cl.
CPC ...... *H01L 51/5209* (2013.01); *H01L 51/5056* (2013.01); *H01L 51/5072* (2013.01); *H01L 51/5092* (2013.01); *H01L 51/5096* (2013.01); *H01L 51/5221* (2013.01); *H01L 51/5253* (2013.01); *H01L 51/56* (2013.01)

(58) Field of Classification Search
CPC ... H01L 51/5056–5068; H01L 51/5072–5084; H01L 51/5096; H01L 51/5206–5218; H01L 2251/5392; H01L 51/5209; H01L 51/56; H01L 51/5253; H01L 51/5092; H01L 51/5221; H01L 51/5212; H01L 27/3279; H01L 51/5203; H01L 51/5237
USPC .......................................................... 257/40
See application file for complete search history.

(56) References Cited

U.S. PATENT DOCUMENTS

| | | | | |
|---|---|---|---|---|
| 2005/0225234 A1* | 10/2005 | Tyan | ................... | H01L 51/5088 313/504 |
| 2009/0220680 A1* | 9/2009 | Winters | .............. | H01L 51/0021 427/66 |
| 2012/0043550 A1* | 2/2012 | Ito | .......................... | H01L 33/42 257/76 |
| 2014/0159034 A1* | 6/2014 | Yang | ................... | H01L 27/1288 257/43 |
| 2015/0221893 A1* | 8/2015 | Teraguchi | ........... | H01L 27/3248 257/40 |
| 2015/0349209 A1* | 12/2015 | Nagamatsu | .......... | H01L 33/405 257/98 |

(Continued)

FOREIGN PATENT DOCUMENTS

| | | | |
|---|---|---|---|
| JP | 2001035667 | * | 2/2001 |
| KR | 10-2011-0128242 A | | 11/2011 |
| KR | 10-2019-0006836 A | | 1/2019 |

*Primary Examiner* — Mohammad M Hoque
(74) *Attorney, Agent, or Firm* — Polsinelli PC

(57) ABSTRACT

A lighting apparatus has improved aperture ratio by changing auxiliary lines in a lattice shape into a line shape. In addition, a conductive layer having a high resistance is formed on the entire surface to control excessive current due to a short circuit, and an island-shaped anode is formed in the emission zone to reduce the resistance in the pixel, thereby preventing the luminance from being lowered.

17 Claims, 24 Drawing Sheets

(56) References Cited

U.S. PATENT DOCUMENTS

2016/0293888 A1\* 10/2016 Shim .................. H01L 51/5228

\* cited by examiner

LIGHTING APPARATUS USING ORGANIC LIGHT EMITTING DIODE HAVING CONDUCTIVE LAYER WITH HIGH RESISTANCE ON SUBSTRATE

CROSS-REFERENCE TO RELATED APPLICATION

This application claims the priority of Korean Patent Application No. 10-2018-0085280 filed on Jul. 23, 2018, in the Korean Intellectual Property Office, which is incorporated by reference in its entirety.

BACKGROUND

Field of the Disclosure

The present disclosure relates to a lighting apparatus, and more particularly to a lighting apparatus using organic light-emitting diodes.

Description of the Background

Fluorescent lamps or incandescent lamps are currently used as lighting apparatuses. Incandescent lamps have good color rendering index (CRI) but have very low energy efficiency. Fluorescent lamps have good energy efficiency but have low CRI and contain mercury, which results in environmental problems.

A CRI is a quantitative measure of the ability of a light source to reveal the colors of various objects faithfully in comparison with an ideal or natural light source. The CRI of sunlight is 100.

To overcome such problems of existing lighting apparatuses, light-emitting diodes (LEDs) have recently been proposed as lighting apparatuses. A light-emitting diode is made of an inorganic light-emitting material and has the highest luminous efficiency in the red wavelength range, and the luminous efficiency decreases toward the green wavelength range that has the highest luminosity factor. Therefore, when white light is emitted by combining a red light-emitting diode, a green light-emitting diode, and a blue light-emitting diode, the luminous efficiency is lowered.

As another alternative, a lighting apparatus using organic light-emitting diodes (OLED) is being developed. In a lighting apparatus using organic light-emitting diodes, an anode made of ITO is formed on a glass substrate. Then, an organic layer and a cathode are formed on the anode, and a passivation layer and a lamination film are formed thereon.

Such a lighting apparatus using organic light-emitting diodes has a shortcoming that when a short-circuit is created by particles in a pixel, the overall brightness of the panel as well as the pixel is lowered due to a current drop.

SUMMARY

The present disclosure is to provide a lighting apparatus using organic light-emitting diodes that prevents the existing problem that the overall luminance of the panel is lowered when a short-circuit occurs.

In addition, the present disclosure is to provide a lighting apparatus using organic light-emitting diodes that prevents the problem without compromising the aperture ratio.

The present disclosure is not limited to the above-mentioned aspects, which are not mentioned above, can be clearly understood by those skilled in the art from the following descriptions.

According to an aspect of the present disclosure, there is provided a lighting apparatus using organic light-emitting diodes, including: a conductive layer disposed on a substrate; auxiliary lines arranged on the conductive layer in a line shape; an anode disposed in each of pixels between the auxiliary lines and made of a conductive material having a resistance lower than that of the conductive layer; a passivation layer disposed on the auxiliary lines; an organic layer and a cathode disposed in an emission area of the substrate where the passivation layer is disposed; and a metal film disposed in the emission area of the substrate.

According to another aspect of the present disclosure, there is provided a lighting apparatus using organic light-emitting diodes, including: a conductive layer disposed on a substrate; auxiliary lines arranged on the conductive layer in a line shape; an anode disposed in each of pixels between the auxiliary lines and made of a conductive material having a resistance lower than that of the conductive layer; a passivation layer disposed on the auxiliary lines; an organic layer and a cathode disposed in an emission area of the substrate where the passivation layer is disposed; and a metal film disposed in the emission area of the substrate. A current difference caused by locations of the pixels in a panel is compensated by adjusting a distance between the auxiliary lines and the anode in each of the pixels.

Other detailed matters of the exemplary aspects are included in the detailed description and the drawings.

According to an exemplary aspect of the present disclosure, a short-circuit reduction pattern as well as vertical auxiliary line can be eliminated by employing a conductive layer having a high resistance, and thus the emission zone can be increased. As a result, the luminance can be improved.

In addition, according to an exemplary aspect of the present disclosure, by increasing the aperture ratio, the lifetime of the lighting apparatus can be elongated.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
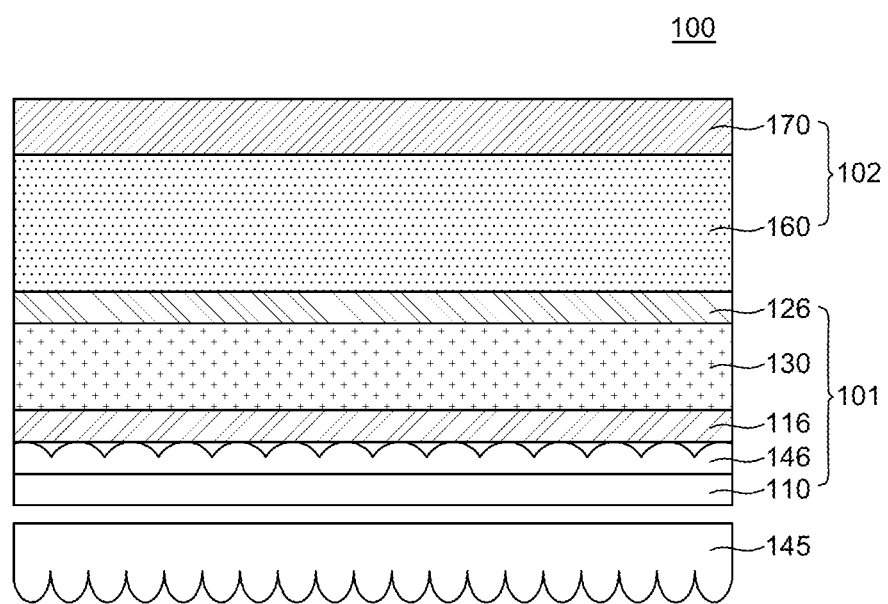
FIG. 1 is a cross-sectional view showing an example of a lighting apparatus using organic light-emitting diodes according to a first exemplary aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Hereafter, various aspects of the present disclosure will be described in detail with reference to the accompanying drawings.

Hereinafter, exemplary aspects of the present disclosure will be described in detail with reference to the accompanying drawings.

FIG. 1 is a cross-sectional view showing an example of a lighting apparatus using organic light-emitting diodes according to a first exemplary aspect of the present disclosure.

Figure 2:
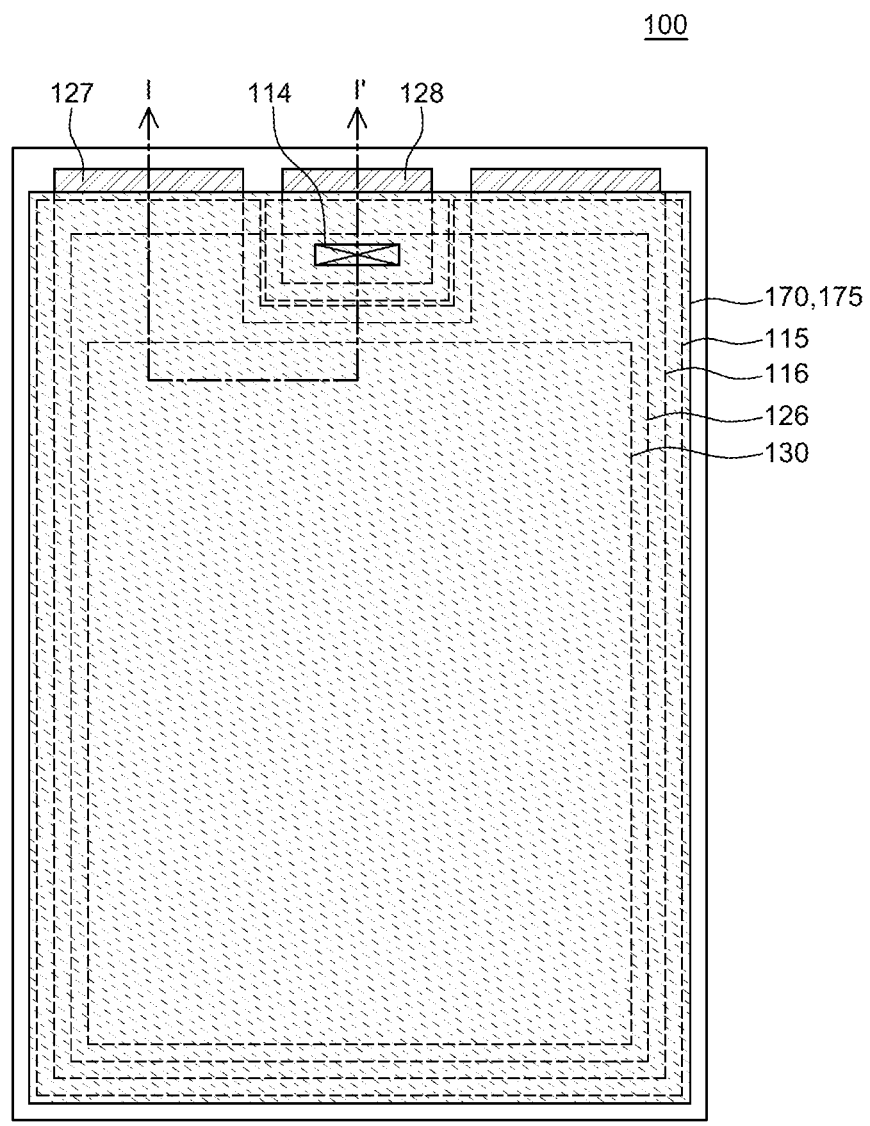
FIG. 2 is a plan view showing an example of the lighting apparatus using organic light-emitting diodes according to the first exemplary aspect of the present disclosure.

FIG. 2 is a plan view showing an example of the lighting apparatus using organic light-emitting diodes according to the first exemplary aspect of the present disclosure.

Figure 3:
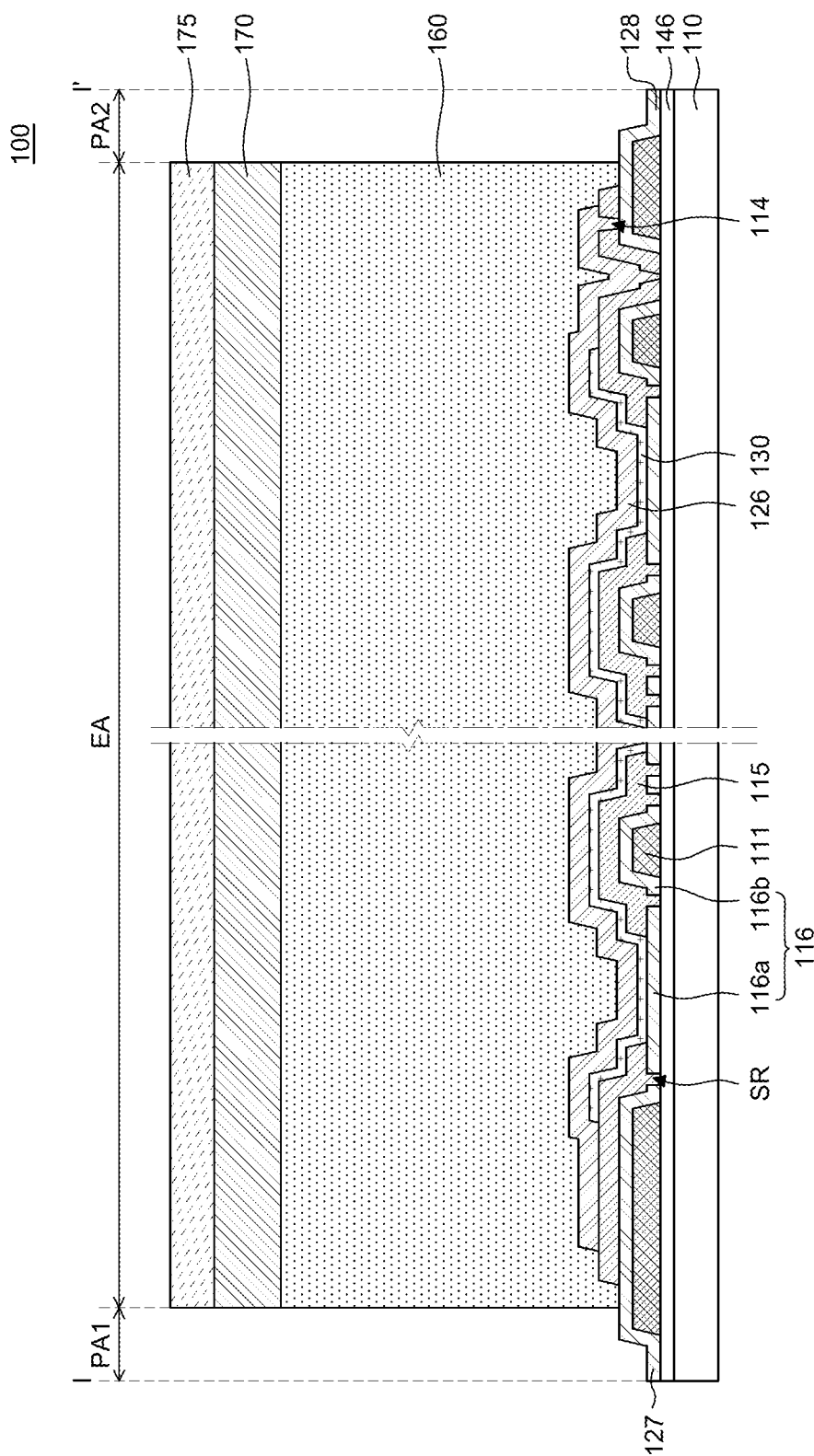
FIG. 3 is a cross-sectional view showing the lighting apparatus according to the first exemplary aspect, taken along line I-I' of FIG. 2.

FIG. 3 is a cross-sectional view showing the lighting apparatus according to the first exemplary aspect, taken along line I-I' of FIG. 2.

Figure 4A:
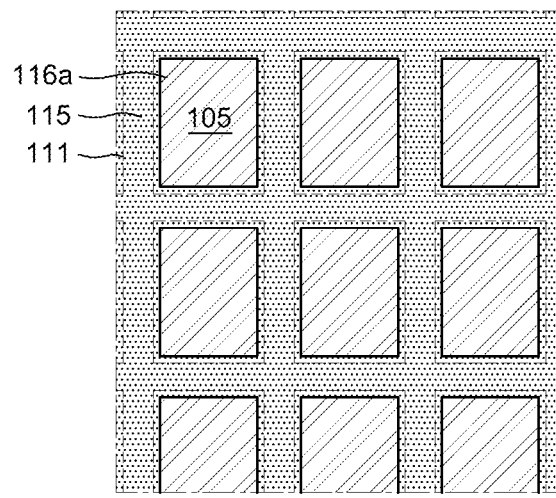
FIGS. 4A and 4B are enlarged views showing a part of the lighting apparatus shown in FIG. 2.
Figure 4B:
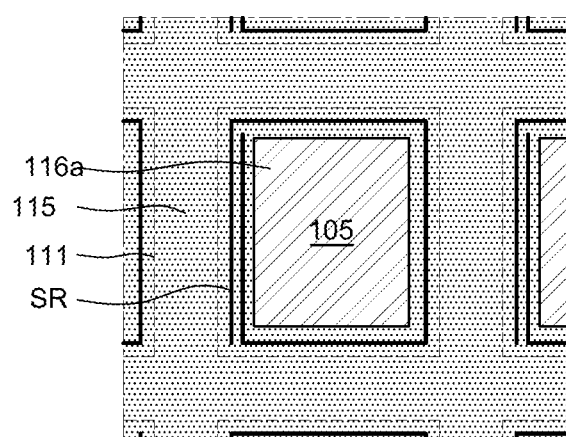

FIGS. 4A and 4B are enlarged views showing a part of an emission area shown in FIG. 2. FIG. 4B is an enlarged view showing a single pixel of FIG. 4A.

According to an exemplary aspect of the present disclosure, a lighting apparatus using organic light-emitting diodes made of an organic material is provided, instead of a lighting apparatus using inorganic light-emitting diodes made of an inorganic material.

An organic light-emitting diode made of an organic light-emitting material exhibits better luminous efficiency of green and red light than an inorganic light-emitting diode. In addition, since organic light-emitting diodes have larger widths of the emission peak of red, green and blue light than those of the inorganic light-emitting diodes, the CRI is improved, so that there is an advantage that the light emitted from the lighting apparatus become more similar to the sunlight.

In the following description, a flexible lighting apparatus is described as a lighting apparatus according to an exemplary aspect of the present disclosure as an example. It is, however, to be understood that the present disclosure can be equally applied to typical lighting apparatuses as well.

Referring to FIGS. 1 to 4A and 4B, a lighting apparatus 100 using organic light-emitting diodes according to the first exemplary aspect of the present disclosure may include an organic light-emitting diode unit 101 where surface light-emitting occurs, and an encapsulation unit 102 for encapsulating the organic light-emitting diode unit 101.

An outer light extraction layer 145 may be further disposed under the organic light-emitting diode unit 101 to increase haze. It is, however, to be understood that the present disclosure is not limited thereto, and the outer light extraction layer may be eliminated.

The outer light extraction layer 145 may be formed by dispersing scattering particles such as $TiO_2$ in a resin and may be attached under a substrate 110 by an adhesive layer (not shown).

The organic light-emitting diode unit 101 may include an organic light-emitting diode disposed on the substrate 110, and an inner light extraction layer 146 may be further disposed between the substrate 110 and the organic light-emitting diode. It is, however, to be understood that the present disclosure is not limited thereto, and the inner light extraction layer may be eliminated.

A planarization layer (not shown) may be further disposed on the inner light extraction layer 146.

In particular, referring to FIG. 3, the lighting apparatus 100 according to the exemplary aspect of the present disclosure may include an emission area EA where light is actually emitted and output to the outside, and pad areas PA1 and PA2 where pad electrodes 127 and 128 are connected to an external device, respectively, to apply signals to the emission area EA.

The pad areas PA1 and PA2 are not covered by the sealing means of a metal film 170 and/or a protective film 175 and thus can be electrically connected to an external device through the pad electrodes 127 and 128, respectively. Therefore, the metal film 170 and/or the protective film 175 may be attached to the entire surface of the emission area EA of the substrate 110 except for the pad areas PA1 and PA2. It is, however, to be understood that the present disclosure is not limited thereto.

That is to say, a passivation layer 115, an organic layer 130 and a cathode 126 are not formed in the pad areas PA1 and PA2 outside the emission area EA, and thus the pad electrodes 127 and 128 may be exposed to the outside. Although not shown in the drawings, a second passivation layer of an organic material and a third passivation layer of an inorganic material may be further formed in the emission area EA so as to cover the organic layer 130 and the cathode 126. It is, however, to be understood that the present disclosure is not limited thereto.

A part of the passivation layer 115 on the second pad electrode 128 located in the emission area EA may be removed, such that a contact hole 114 for exposing the second pad electrode 128 may be formed. Accordingly, the cathode 126 may be electrically connected to the second pad electrode 128 through the contact hole 114.

The pad areas PA1 and PA2 may be located outside the emission area EA. Although the second pad area PA2 is located between the first pad areas PA1 in the example shown in FIG. 2, the present disclosure is not limited thereto.

In addition, FIG. 2 shows an example where the pad areas PA1 and PA2 are located only on one outer side of the emission area EA, but the present disclosure is not limited thereto. In other implementations, the pad areas PA1 and PA2 may be located on both outer sides of the emission area EA. In addition, according to another exemplary aspect of the present disclosure, the first pad area PA1 may be located on one outer side of the emission area EA, and the second pad area PA2 may be located on the other side of the emission area EA.

The organic light-emitting diode unit 101 will be described in detail. An anode 116 and a cathode 126 are disposed on the substrate 110, and the organic layer 130 is disposed between the anode 116 and the cathode 126, to form an organic light-emitting diode (OLED).

In addition, the organic light-emitting diode unit may further include an auxiliary lines 111 for supplementing the conductivity of the anode 116, and a passivation layer 115 for preventing a short-circuit between the anode 116 and the cathode 126.

In the lighting apparatus 100 having the above-described structure, as electric current is applied to the anode 116 and the cathode 126 of the organic light-emitting diode, the organic layer 130 emits light through the emission area EA.

The substrate 110 may be made of transparent glass. In addition, the substrate 110 may be made of a polymer material having flexibility.

The anode 116 may supply holes to the organic layer 130 while the cathode 126 may supply electrons to the organic layer 130. It is, however, to be understood that the present disclosure is not limited thereto. The anode 116 and the cathode 126 may have different roles.

The anode 116 may be formed of indium tin oxide (TO) or indium zinc oxide (IZO), which is a transparent metal oxide material having a high work function and high conductivity to facilitate injection of holes into the organic layer 130.

The anode 116 may be divided into a first anode 116a in an emission zone 105 and a second anode 116b in a non-emission zone other than the emission zone 105.

The second anode 116b may be disposed on the auxiliary lines 111 to cover it. The first anode 116a may be formed in the emission zone 105 defined by the auxiliary lines 111 in the form of a lattice.

The cathode 126 may be made of a conductive material having a low work function to facilitate injection of electrons into the organic layer 130. Examples of the material of the cathode 126 may include a metal such as magnesium (Mg), calcium (Ca), sodium (Na), titanium (Ti), indium (In), yttrium (Y), lithium (Li), gadolinium (Gd), aluminum (Al), silver (Ag), tin (Sn) and lead (Pb), or an alloy thereof.

The organic layer 130 may be made up of a single stack structure including a red organic emissive layer, a multi-stack tandem structure including a plurality of red organic emissive layers, or a multi-stack tandem structure including red/green organic emissive layers and a sky-blue organic emissive layer. It is, however, to be understood that the organic layer 130 of the present disclosure is not limited to the above-described structure, and various structures may be employed.

The organic layer 130 may further include an electron injection layer and a hole injection layer for injecting electrons and holes, respectively, into the organic emissive layer, an electron transport layer and a hole transport layer for transporting the injected electrons and holes, respectively, to the organic emissive layer, and a charge generation layer for generating charges such as electrons and holes.

When electric current is applied to the anode 116 and the cathode 126, electrons are injected into the organic layer 130 from the cathode 126 while holes are injected from the anode 116 into the organic layer 130. Thereafter, excitons are generated in the organic layer 130. As the excitons decay, light is generated, which is equal to the energy difference between the lowest unoccupied molecular orbital (LUMO) and the highest occupied molecular orbital (HOMO).

The light generated in the organic layer 130 may travel upward (top-emission) or downward (bottom-emission) depending on the transmittance and reflectance of the anode 116 and the cathode 126.

For example, when the anode 116 is a transparent electrode while the cathode 126 is a reflective electrode, the light generated in the organic layer 130 is reflected by the cathode 126 to be transmitted through the anode 116, such that the light exits through the bottom of the organic light-emitting diode unit 101. That is to say, the organic light-emitting diode unit 101 is of the bottom-emission type. It is, however, to be understood that the present disclosure is not limited thereto. When the anode 116 is a reflective electrode while the cathode 126 is a transparent electrode, the organic light-emitting diode unit 101 may be of the top-emission type.

A buffer layer (not shown) may be disposed under the anode 116 to block moisture and air permeating through the substrate 110 and the inner light extraction layer 146. To this end, the buffer layer 240 may be made up of a single layer of an inorganic material such as silicon oxide (SiOx) and silicon nitride (SiNx) or a composite layer of an inorganic material and an organic material as desired.

The inner light extraction layer 146 may be disposed between the substrate 110 and the buffer layer to increase the efficiency of extracting light generated from the organic light emitting device to the outside.

The inner light extraction layer 146 can increase the light extraction efficiency by increasing the internal light scattering and increasing the surface roughness by way of embedding titanium dioxide (TiO2) particles into the resin. For example, the inner light extracting layer 146 may be by inkjet-coating so that it has the thickness of 450 nm, and the diameter of the TiO2 particles may range from 200 nm to 300 nm. It is to be noted that such specific numerical values may vary depending on the design choice of the lighting apparatus 100.

A planarization layer may be disposed on the inner light extraction layer 146 to compensate for the surface roughness of the inner light extraction layer 146 and to improve the reliability of the organic light-emitting diode unit 101.

The planarization layer is formed by embedding zirconia particles into a resin and can compensate for the surface roughness of the inner light extraction layer 146. As an example, the planarization layer may be formed by inkjet-coating so that it has the thickness of 150 nm, and the diameter of the zirconia particles may be 50 nm. It is to be noted that such specific numerical values may vary depending on the design choice of the lighting apparatus 100.

The encapsulation unit 102 may cover the organic light-emitting diode unit 101 and block external influences to protect the organic light-emitting diode unit 101. The encapsulation unit 102 may include an adhesive layer 160 in contact with the cathode 126, the metal film 170 in contact with the adhesive layer 160 and the protective film 175 attached to the metal film 170.

The adhesive layer 160 may be implemented as a pressure sensitive adhesive (PSA) for attaching the metal film 170 to the organic light-emitting diode unit 101. The thickness of the adhesive layer 160 may be approximately 30 μm. It is, however, to be understood that the present disclosure is not limited thereto, and the thickness may vary depending on the design choice of the lighting apparatus 100.

The metal film 170 is disposed on the adhesive layer 160 and serves to maintain the rigidity of the lighting apparatus 100. To this end, the metal film 170 may be formed of copper (Cu) having a thickness of approximately 20 μm. It is, however, to be understood that the present disclosure is not limited thereto, but the thickness may vary depending on the design choice of the lighting apparatus 100.

The protective film 175 may be disposed on the metal film 170 to absorb external impact to protect the lighting apparatus 100. To this end, the protective film 175 may be implemented as a polyethylene terephthalate (PET) having a thickness of approximately 100 μm, which is a polymer film. It is, however, to be understood that the present disclosure is not limited thereto, but the protective film 175 may be modified depending on the design choice of the lighting apparatus 100.

Incidentally, in the lighting apparatus 100 using organic light-emitting diodes, when a short-circuit occurs between the anode 116 and the cathode 126 due to particles, a current drop occurs across the entire panel, such that the overall luminance of the panel as well as the pixel where the short-circuit occurs may be lowered.

In view of the above, in the lighting apparatus 100 according to the first exemplary aspect of the present disclosure, a short-circuit reduction pattern SR is formed on the anode 116 to which current is supplied in each of the pixels by forming a narrow path. The short-circuit reduction pattern SR is covered with the passivation layer 115 to prevent a short-circuit in the entire panel. That is to say, the short-circuit reduction pattern SR surrounds the emission zone 105 of each of the pixels. The current flowing to a short-circuit is limited by adding the resistance in each of the pixels in this manner.

However, as the short-circuit reduction pattern SR is added in each of the pixels, the total aperture ratio is reduced by approximately 8.5% compared to existing devices. That is to say, as the short-circuit reduction pattern SR is added to the border of the emission zone 105, the minimum margin of the passivation layer 115 covering it is increased, such that the aperture ratio is reduced.

In view of the above, according to second and third exemplary aspects of the present disclosure, an auxiliary lines is formed in a line shape instead of a lattice shape, and a high-resistance conductive layer is formed on the entire surface of the substrate, to replace the function of the short-circuit reduction pattern. By doing so, the aperture ratio can be improved.

In addition, according to the second and third exemplary aspects of the present disclosure, an island-shaped anode is additionally formed only in the emission zone to reduce the resistance, thereby preventing the luminance from being lowered by the conductive layer having a high resistance.

Figure 5A:
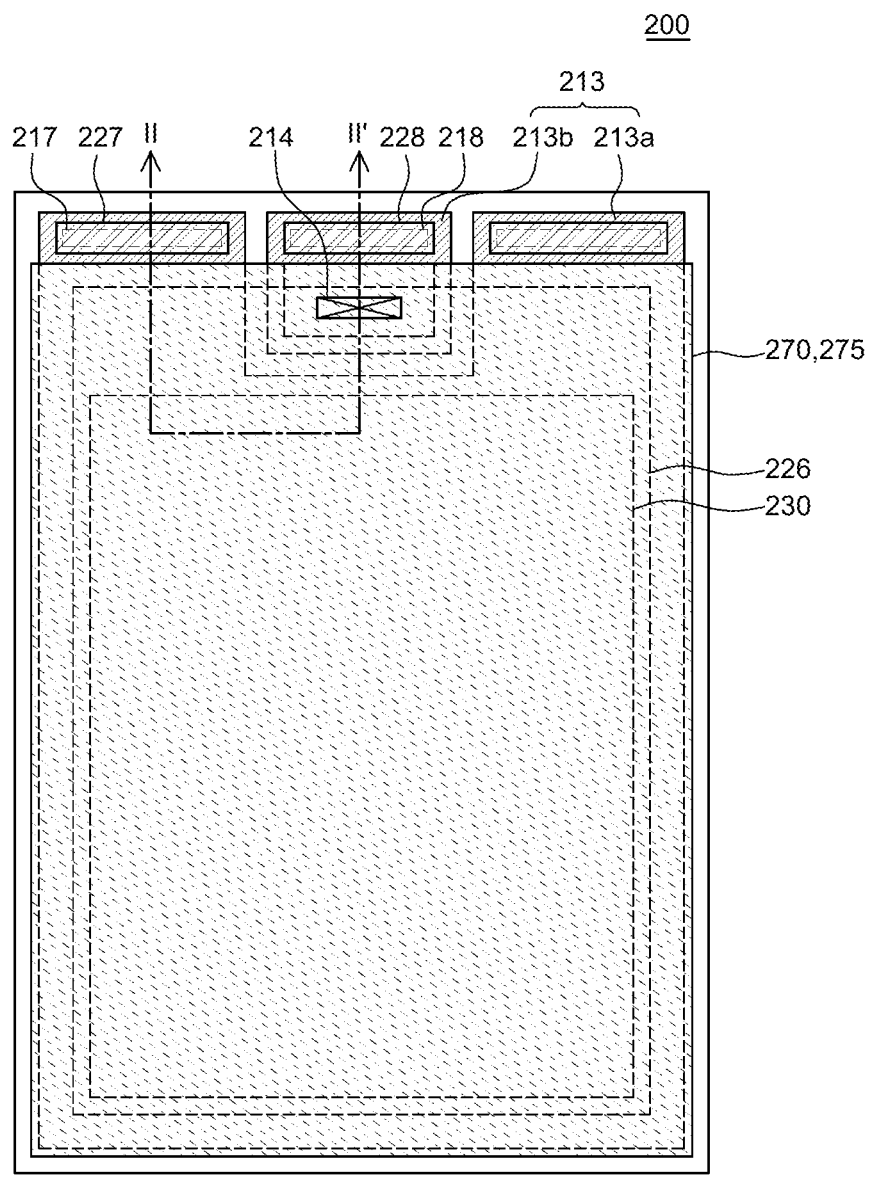
FIGS. 5A to 5C are plan views schematically showing a lighting apparatus using organic light-emitting diodes according to a second exemplary aspect of the present disclosure.
Figure 5B:
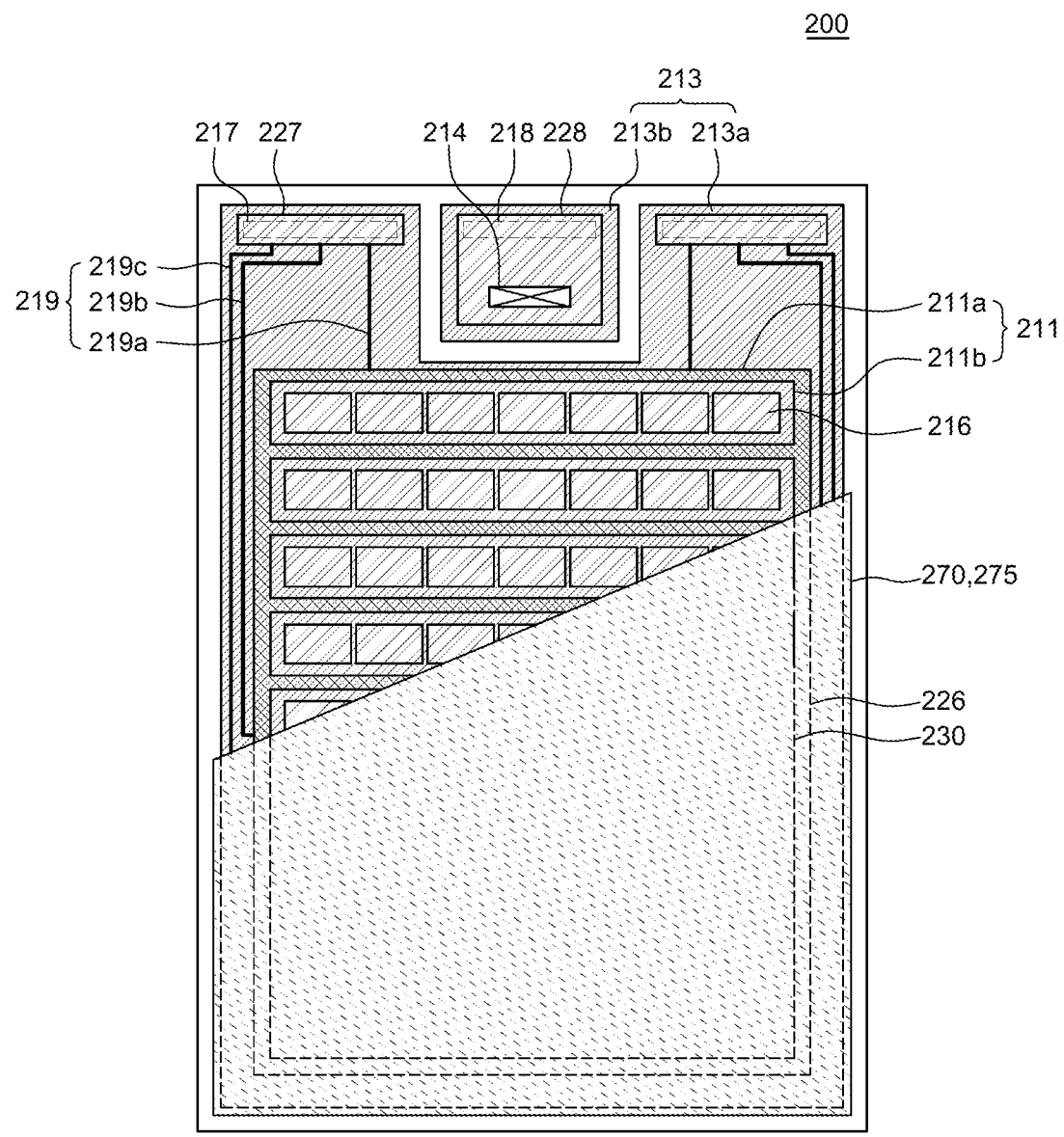
Figure 5C:
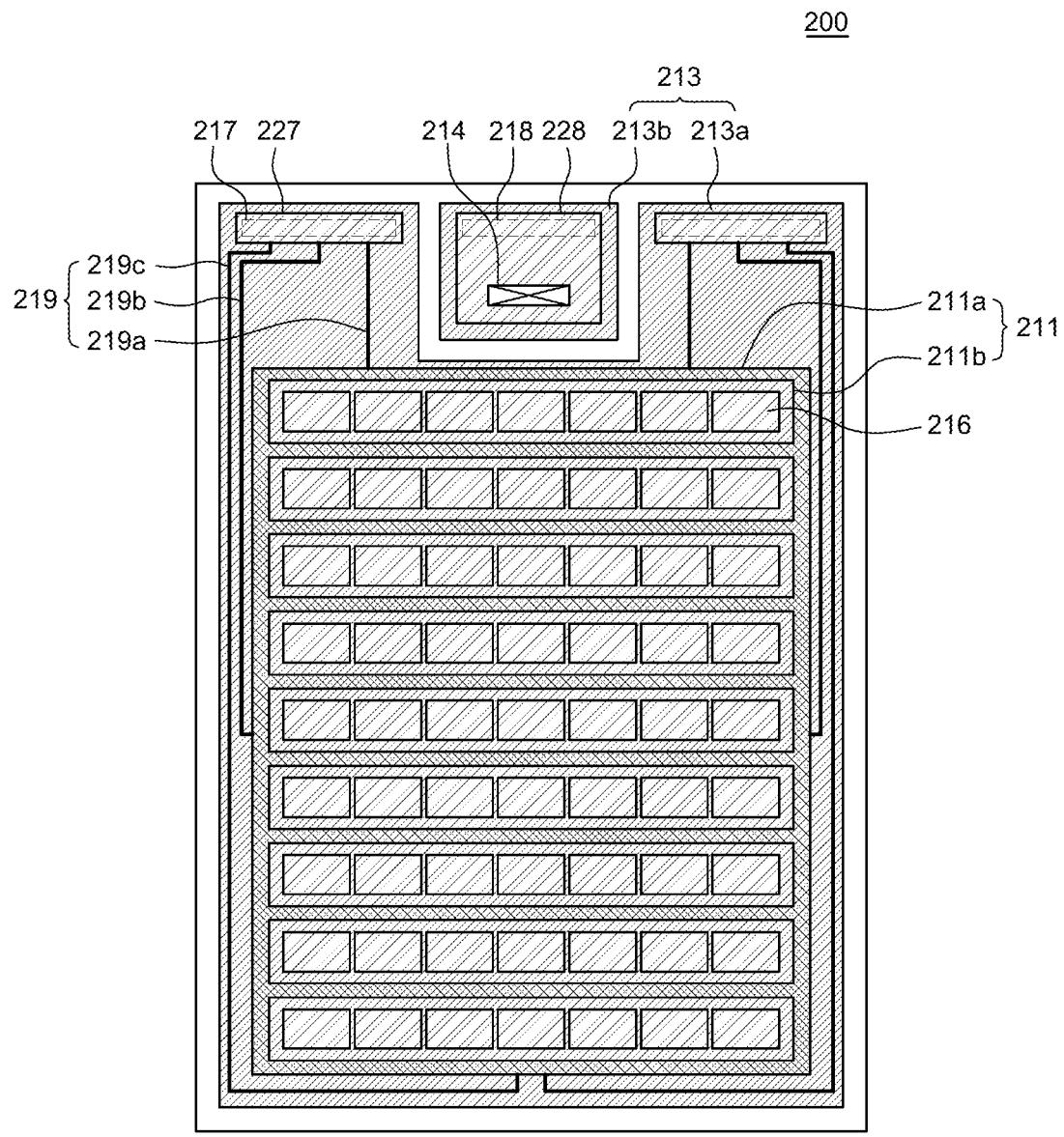

FIGS. 5A to 5C are plan views schematically showing a lighting apparatus using organic light-emitting diodes according to a second exemplary aspect of the present disclosure.

FIG. 5B is a plan view of the lighting apparatus from which the organic layer, the cathode and the encapsulation unit are partially removed. FIG. 5C is a plan view of the lighting apparatus from which the organic layer, the cathode and the encapsulation unit are entirely removed.

Figure 6:
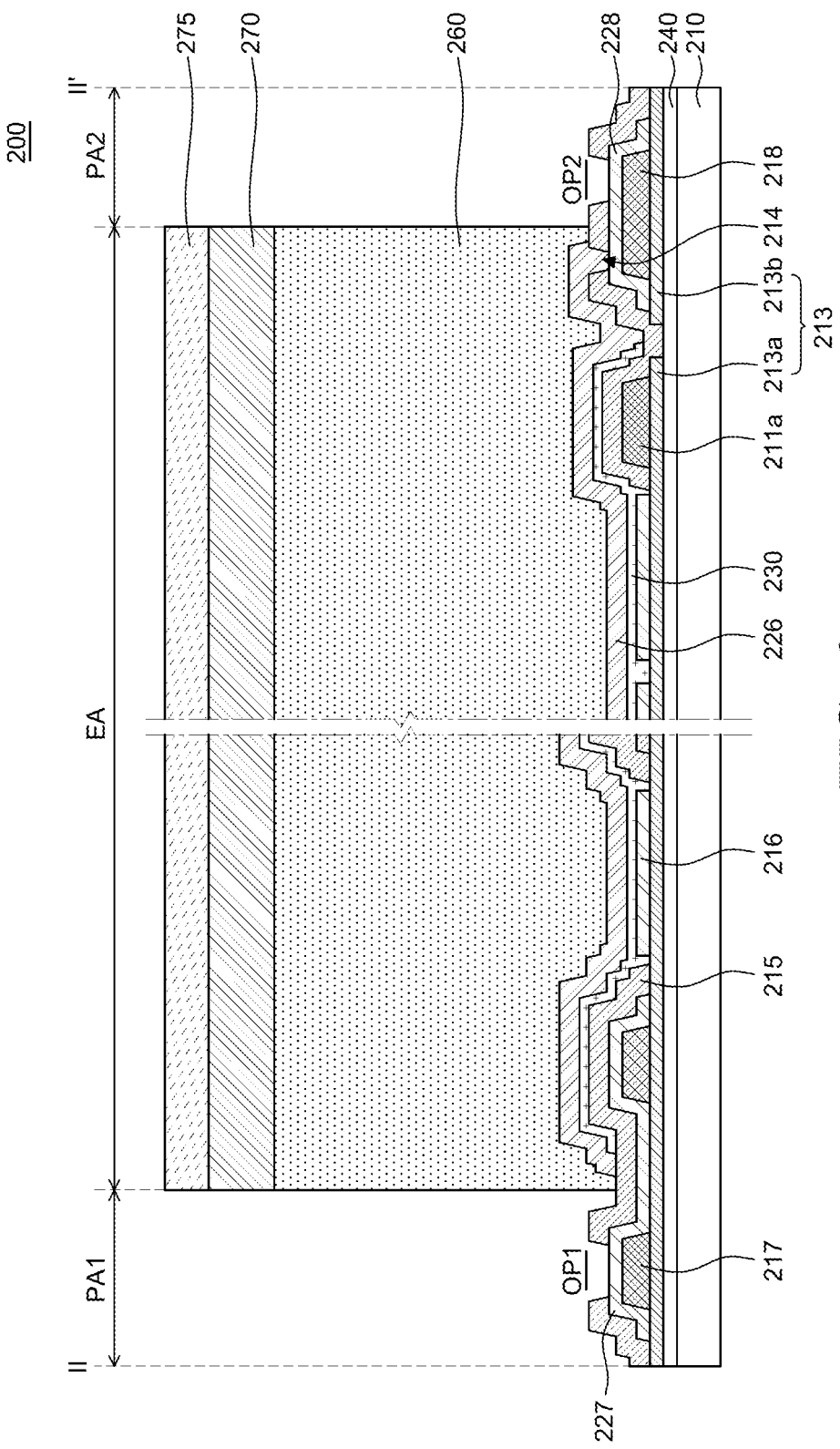
FIG. 6 is a cross-sectional view showing the lighting apparatus using organic light-emitting diodes according to the second exemplary aspect, taken along line II-II' of FIG. 5A.

FIG. 6 is a cross-sectional view showing the lighting apparatus using organic light-emitting diodes according to the second exemplary aspect, taken along line II-II' of FIG. 5A.

According to the exemplary aspect of the present disclosure, the lighting apparatus uses organic light-emitting diodes made of an organic material. In the lighting apparatus using organic light-emitting diodes, a TFT for driving may not be disposed in each of the pixels.

As described above, the lighting apparatus using organic light-emitting diodes according to the second exemplary aspect of the present disclosure may include an organic light-emitting diode unit where surface-emission occurs, and an encapsulation unit that encapsulates the organic light-emitting diode unit.

An outer light extraction layer may be further disposed under the organic light-emitting diode unit to increase the haze. It is, however, to be understood that the present disclosure is not limited thereto, and the outer light extraction layer may be eliminated.

The outer light extraction layer 145 may be formed by dispersing scattering particles such as TiO2 in a resin and may be attached under the substrate by an adhesive layer.

The organic light-emitting diode unit may include an organic light-emitting diode disposed on the substrate, and an inner light extraction layer may be further disposed between the substrate and the organic light-emitting diode.

It is, however, to be understood that the present disclosure is not limited thereto, and the inner light extraction layer may be eliminated.

A planarization layer may be further disposed on the inner light extraction layer.

In particular, referring to FIGS. 5A to 5C and 6, the lighting apparatus 200 according to the second exemplary aspect of the present disclosure may include an emission area EA where light is actually emitted and output to the outside, and pad areas PA1 and PA2 where pad electrodes 227 and 228 are connected to an external device, respectively, to apply signals to the emission area EA.

The pad areas PA1 and PA2 are not covered by the sealing means of a metal film 270 and/or a protective film 275 and thus can be electrically connected to an external device through the pad electrodes 227 and 228, respectively. The pad electrodes 227 and 228 may be exposed to the outside through the open holes OP1 and OP2, respectively. Therefore, the metal film 270 and/or the protective film 275 may be attached to the entire surface of the emission area EA of the substrate 210 except for the pad areas PA1 and PA2. It is, however, to be understood that the present disclosure is not limited thereto.

Specifically, the organic layer 230 and the cathode 226 are not formed in the pad areas PA1 and PA2 outside the emission area EA, and a passivation layer 215 is partially removed to form open holes OP1 and OP2. Accordingly, pad electrodes 227 and 228 can be exposed to the outside through the open holes OP1 and OP2. Although not shown in the drawings, a second passivation layer of an organic material and a third passivation layer of an inorganic material may be further formed in the emission area EA so as to cover the organic layer 230 and the cathode 226. It is, however, to be understood that the present disclosure is not limited thereto.

In addition, a part of the passivation layer 215 on the second pad electrode 228 located in the emission area EA may be removed, such that a contact hole 214 for exposing the second pad electrode 228 may be formed. Accordingly, the cathode 226 may be electrically connected to the second pad electrode 228 through the contact hole 214.

The pad areas PA1 and PA2 may be located outside the emission area EA. Although the second pad area PA2 is located between the first pad areas PA1 in the example shown in FIGS. 5A to 5C, the present disclosure is not limited thereto.

In addition, FIGS. 5A to 5C shows an example where the pad areas PA1 and PA2 are located only on one outer side of the emission area EA, but the present disclosure is not limited thereto. In other implementations, the pad areas PA1 and PA2 may be located on both outer sides of the emission area EA. In addition, according to another exemplary aspect of the present disclosure, the first pad area PA1 may be located on one outer side of the emission area EA, and the second pad area PA2 may be located on the other side of the emission area EA.

Next, the organic light-emitting diode unit will be described in detail. An anode 216 and a cathode 226 are disposed on the substrate 210, and an organic layer 230 is disposed between the anode 216 and the cathode 226 to form an organic light-emitting diode.

In addition, the organic light-emitting diode unit may further include an auxiliary lines 211 for supplementing the conductivity of the anode 216, and a passivation layer 215 for preventing a short-circuit between the anode 216 and the cathode 226.

In the lighting apparatus 200 having the above-described structure, as electric current is applied to the anode 216 and the cathode 226 of the organic light-emitting diode, the organic layer 230 emits light through the emission area EA.

The substrate 210 may be made of transparent glass. In addition, the substrate 210 may be made of a polymer material having flexibility.

A buffer layer 240 may be disposed on the substrate 210. It is, however, to be understood that the present disclosure is not limited thereto.

On the buffer layer 240, a conductive layer 213 having a high resistance according to the second exemplary aspect may be disposed.

The conductive layer 213 may be made of a transparent conductive material having a high resistance of approximately 104 to 105 Ω/□.

The conductive layer 213 may include a first conductive layer 213a disposed in the emission area EA and the first pad area PA1, and a second conductive layer 213b disposed in the second pad area PA2. The first conductive layer 213a and the second conductive layer 213b may be separated from each other in the emission area EA.

The conductive layer 213 having a high resistance can limit the current flowing to a short-circuit, and thus the short-circuit reduction pattern according to the first exemplary aspect of the present disclosure can be eliminated. In addition, the auxiliary lines 211 have a line shape instead of the existing lattice shape, and thus it is also possible to improve the aperture ratio. Moreover, as vertical auxiliary lines for forming the non-emission zone in the pixels can be eliminated, the emission zone can be substantially widened. The auxiliary lines 211 may include a plurality of first auxiliary lines 211a in the horizontal direction and second auxiliary lines 211b in the vertical direction connecting between the ends of the first auxiliary lines 211a. It is, however, to be understood that the present disclosure is not limited thereto. The auxiliary lines 211 according to some exemplary aspects of the present disclosure may not include the second auxiliary lines 211b.

In addition, in the lighting apparatus 200 according to the second exemplary aspect, a plurality of connection lines 219; 219a, 219b and 219c are disposed on the edges thereof, such that the first pad electrode 227 is connected to the auxiliary lines 211 and thus current is supplied vertically and horizontally to supplement the luminance uniformity. For example, the connection lines 219; 219a, 219b and 219c may include a first connection line 219a for connecting between the first auxiliary lines 211a on the upper side and the first pad electrode 227 to supply a current from above, a second connection line 219b for connecting between the second auxiliary lines 211b on the left and right sides and the first pad electrode 227 to supply a current from the left and right, and a third connection line 219c for connecting between the first auxiliary lines 211a on the lower side and the first pad electrode 227 to supply a current from below.

The connection lines 219; 219a, 219b and 219c may be formed on the first conductive layer 213a.

The connection lines 219; 219a, 219b and 219c may be made of the same material and in the same layer as the anode 216. It is, however, to be understood that the present disclosure is not limited thereto.

A first auxiliary pad electrode 217 and a second auxiliary pad electrode 218 made of the same material as the auxiliary lines 211 may be further disposed under the first pad electrode 227 and the second pad electrode 228. It is, however, to be understood that the present disclosure is not limited thereto.

In addition, according to the second and third exemplary aspects of the present disclosure, an island-shaped anode 216 is additionally formed in the emission zone to reduce the resistance of the emission zone, thereby preventing the luminance from being lowered by the conductive layer having a high resistance.

As described above, the anode 216 may supply holes to the organic layer 230 while the cathode 226 may supply electrons to the organic layer 230. It is, however, to be understood that the present disclosure is not limited thereto. The anode 216 and the cathode 226 may have different roles.

The anode 216 may be formed of indium tin oxide (ITO) or indium zinc oxide (IZO), which is a transparent metal oxide material having a high work function and higher conductivity than the conductive layer 213 to facilitate injection of holes into the organic layer 230.

The anode 216 according to the second exemplary aspect may be formed in a generally rectangular island shape to define an emission zone. That is to say, the region where the anode 216 and the cathode 226 overlap with each other may be defined as the emission zone where light is generated in the organic layer 230 disposed between the anode 216 and the cathode 226. It is, however, to be understood that the present disclosure is not limited thereto.

The cathode 226 may be made of a conductive material having a low work function to facilitate injection of electrons into the organic layer 230. Examples of the material of the cathode 226 may include a metal such as magnesium (Mg), calcium (Ca), sodium (Na), titanium (Ti), indium (In), yttrium (Y), lithium (Li), gadolinium (Gd), aluminum (Al), silver (Ag), tin (Sn) and lead (Pb), or an alloy thereof.

The organic layer 230 may be made up of a single stack structure including a red organic emissive layer, a multi-stack tandem structure including a plurality of red organic emissive layers, or a multi-stack tandem structure including red/green organic emissive layers and a sky-blue organic emissive layer. It is, however, to be understood that the organic layer 230 of the present disclosure is not limited to the above-described structure, and various structures may be employed.

Figure 7A:
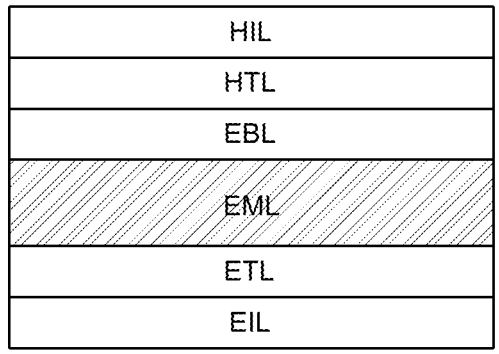
FIGS. 7A to 7C are cross-sectional views showing an example of a stack structure of an organic layer according to an exemplary aspect of the present disclosure.
Figure 7B:
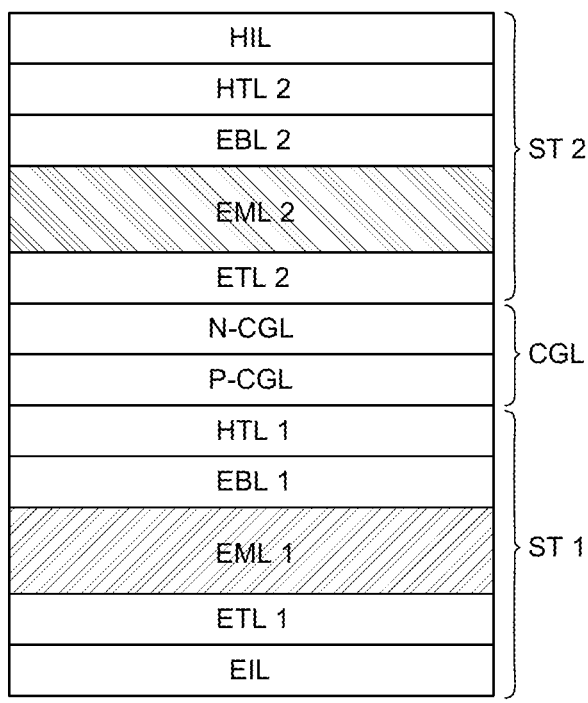
Figure 7C:
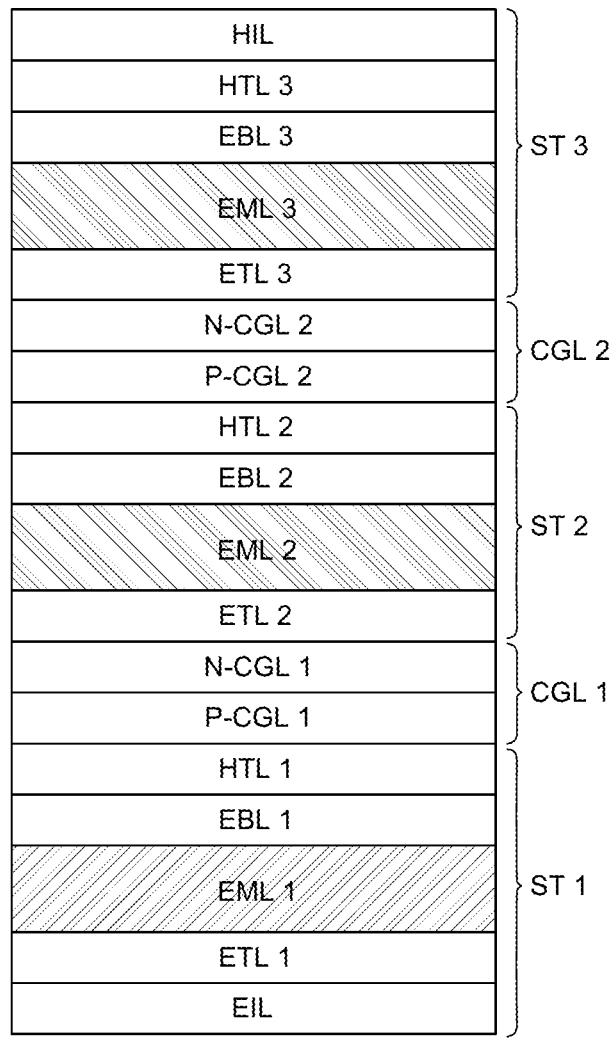

FIGS. 7A to 7C are cross-sectional views showing an example of a stack structure of an organic layer according to an exemplary aspect of the present disclosure.

Specifically, FIG. 7A shows an organic layer 230 of a single stack, FIG. 7B shows an organic layer 230 of a tandem structure including a double stack, and FIG. 7C shows an organic layer 230 of a tandem structure including a triple stack.

Referring to FIG. 7A, the organic layer 230 may include a hole injection layer HIL, a hole transport layer HTL, an electron blocking layer EBL, an organic emissive layer EML, an electron transport layer ETL and an electron injection layer EIL sequentially stacked on one another.

The hole injection layer HIL is an organic layer that facilitates the injection of holes from the anode 216 into the organic emissive layer EML. The hole injection layer HIL may be made of, but is not limited to, a material including at least one selected from the group consisting of: HAT-CN (dipyrazino[2,3-f:2',3'-h]quinoxaline-2,3,6,7,10.11-hexacarbonitrile), CuPc(copper phthalocyanine), F4-TCNQ(2,3,5, 6-tetrafluoro-7,7,8,8-tetracyano-quinodimethane), and NPD (N,N'-bis(naphthalene-1-yl)-N,N'-bis(phenyl)-2,2'-dimethylbenzidine).

The hole transport layer HTL is an organic layer that facilitates transfer of holes from the hole injection layer HIL into the organic emissive layer EML. The hole transport layer HTL may be made of, but is not limited to, a material including at least one selected from the group consisting of: NPD(N,N'-bis(naphthalene-1-yl)-N,N'-bis(phenyl)-2,2'-dimethylbenzidine), TPD(N,N'-bis-(3-methylphenyl)-N,N'-bis(phenyl)-benzidine), s-TAD(2,2',7,7'-tetrakis(N,N-dimethylamino)-9,9-spirofluorene) and MTDATA(4,4',4"-Tris (N-3-methylphenyl-N-phenyl-amino)-triphenylamine).

The electron blocking layer is an organic layer that suppresses electrons injected into the organic emissive layer EML from overflowing to the hole transport layer HTL. The electron blocking layer can improve the bonding of holes and electrons in the organic emissive layer EML by suppressing the movement of electrons and can improve the luminous efficiency of the organic emissive layer EML. The electron blocking layer EBL may be made of the same material as the hole transport layer HTL. Although the hole transport layer HTL and the electron blocking layer EBL may be formed as separate layers, the present disclosure is not limited thereto. The hole transport layer HTL and the electron blocking layer EBL may be formed as a single piece.

In the organic emissive layer EML, the holes supplied from the anode 216 and the electrons supplied from the cathode 226 are recombined to generate excitons. The region where the excitons are generated may be referred to as an emission zone or a recombination zone.

The organic emissive layer EML may be disposed between the hole transport layer HTL and the electron transport layer ETL and may include a material that can emit light of a particular color. The organic emissive layer EML may include a material that can emit red light.

The organic emissive layer EML may have a host-dopant system, in which a light-emitting dopant material is doped into a host material occupying a large weight ratio so that the light-emitting dopant material has a small weight ratio.

The organic emissive layer EML may include either a plurality of host materials or a single host material. The organic emissive layer EML comprising a plurality of host materials or a single host material may be doped with a red phosphorescent dopant material. That is to say, the organic emissive layer EML may be a red emissive layer, and the wavelength range of light emitted from the organic emissive layer EML may range approximately from 600 nm to 660 nm.

The red phosphorescent dopant material is a substance capable of emitting red light. The EL spectrum of the light emitted from the organic emissive layer EML doped with a red phosphorescent dopant material may have a peak in the range of red wavelength or near it.

The red phosphorescent dopant material may be made of, but is not limited to, a material including at least one of iridium (Ir) ligand complexes including Ir(ppy)3(fac tris(2-phenylpyridine)iridium), PIQIr(acac)(bis(1-phenylisoquinoline) acetylacetonate iridium), PQIr(acac)(bis(1-phenylquinoline) acetylacetonate iridium), PQIr(tris(1-phenylquinoline) iridium), Ir(piq)3(tris(1-phenylisoquinoline)iridium) and Ir(piq)2(acac)(bis(1-phenylisoquinoline)(acetylacetonate)iridium), PtOEP (octaethylporphyrin platinum) PBD:Eu(DBM)3(Phen) and perylene.

The electron transport layer ETL receives electrons from the electron injection layer EIL. The electron transport layer ETL transfers the supplied electrons to the organic emissive layer EML.

In addition, the electron transport layer ETL may work as a hole blocking layer HBL. The hole blocking layer can suppress the holes that have not participated in the recombination in the organic emissive layer EML from leaking.

The electron transport layer ETL may be made of, but is not limited to, at least one selected from the group consisting of: Liq(8-hydroxyquinolinato-lithium), PBD(2-(4-biphenyl)-5-(4-tert-butylphenyl)-1,3,4-oxadiazole), TAZ(3-(4-biphenyl)4-phenyl-5-tert-butylphenyl-1,2,4-triazole), BCP(2,9-Dimethyl-4,7-diphenyl-1,10-phenanthroline) and BAlq(bis(2-methyl-8-quinolinolate)-4-(phenylphenolato) aluminium).

The electron injection layer EIL is a layer that facilitates the injection of electrons from the cathode 226 to the organic emissive layer EML. The electron injection layer EIL may be made of, but is not limited to, a material including at least one of alkali metal or alkaline earth metal in the form of ions, such as LiF, BaF2 and CsF.

The electron injection layer EIL and the electron transport layer ETL may be eliminated depending on the structure and characteristics of the lighting apparatus 200 using the organic light-emitting diodes.

Referring to FIG. 7B, the organic layer 230 may include a first stack ST1 including a first organic emissive layer EML1, a second stack ST2 including a second organic emissive layer EML2, and a charge generation layer CGL disposed between the first stack ST1 and the second stack ST2.

The first stack ST1 may include an electron injection layer EIL, a first electron transport layer ETL1, a first organic emissive layer EML1, a first electron blocking layer EBL1, and a first hole transport layer HTL1. The second stack ST2 may include a second electron transport layer ETL2, a second organic emissive layer EML2, a second electron blocking layer EBL2, a second hole transport layer HTL2 and a hole injection layer HIL. The functions and configurations of the layers have been described above.

The charge generation layer CGL may be disposed between the first stack ST1 and the second stack ST2. The charge generation layer CGL may supply charges to the first stack ST1 and the second stack ST2 to balance the charges between the first stack ST1 and the second stack ST2.

The charge generation layer CGL may include an n-type charge generation layer N-CGL and a p-type charge generation layer P-CGL. The n-type charge generation layer N-CGL may be in contact with the second electron transport layer ETL2. The p-type charge generation layer P-CGL may be disposed between the n-type charge generation layer N-CGL and the first hole transport layer HTL1. Although the charge generation layer CGL may be made up of multiple layers including the n-type charge generation layer N-CGL and the p-type charge generation layer P-CGL, the present disclosure is not limited thereto. The charge generation layer CGL may be made up of a single layer.

The n-type charge generation layer N-CGL may inject electrons into the first stack ST1. The n-type charge generation layer N-CGL may include an n-type dopant material and an n-type host material. The n-type dopant material may be metals in Groups I and II in the Periodic Table, an organic material to which electrons can be injected, or a mixture thereof. For example, the n-type dopant material may be alkali metal or alkali earth metal. That is to say, the n-type charge generation layer N-CGL may be made of, but is not limited to, an alkali metal such as lithium (Li), sodium (Na), potassium (K) and cesium (Cs), or an alkali earth metal such as magnesium (Mg), strontium (Sr), barium (Ba) and radium (Ra). For example, the n-type host material may be made of a material capable of delivering electrons including, but is not limited to, at least one of Alq3(tris(8-hydroxyquinolino) aluminum), Liq(8-hydroxyquinolinato-lithium), PBD(2-(4-biphenylyl)-5-(4-tert-butylphenyl)-1,3,4-oxadiazole), TAZ(3-(4-biphenyl)4-phenyl-5-tert-butylphenyl-1,2,4-triazole), spiro-PBD, and BAlq(bis(2-methyl-8-quinolinolate)-4-(phenylphenolato)aluminium), SAlq, TPBi(2,2',2"-(1,3,5-benzenetriyl)-tris(1-phenyl-1-H-benzimidazole), oxadiazole, triazole, phenanthroline, benzoxazole or benzthiazole.

The p-type charge generation layer P-CGL may inject holes into the second stack ST2. The p-type charge generation layer P-CGL may include a p-type dopant material and a p-type host material. The p-type dopant material may be made of, but is not limited to, a metal oxide, an organic material such as tetra(fluoro)-tetra(cyano) quinodimethane (F4-TCNQ), HAT-CN (Hexaazatriphenylene-hexacarbonitrile) and hexaazatriphenylene, or a metal material such as V2O5, MoOx and WO3. The p-type host material may be made of a material capable of delivering holes including, but is not limited to, at least one of NPD(N,N-dinaphthyl-N,N'-diphenyl benzidine)(N,N'-bis(naphthalene-1-yl)-N,N'-bis(phenyl)-2,2'-dimethylbenzidine), TPD(N,N'-bis-(3-methylphenyl)-N,N'-bis-(phenyl)-benzidine) and MTDATA(4,4',4-Tris(N-3-methylphenyl-N-phenyl-amino)-triphenylamine).

Referring to FIG. 7C, the organic layer 230 may include a first stack ST1 including a first organic emissive layer EML1, a second stack ST2 including a second organic emissive layer EML2, a third stack ST3 including a third organic emissive layer EML3, a first charge generation layer CGL1 disposed between the first stack ST1 and the second stack ST2, and a second charge generation layer CGL2 disposed between the second stack ST2 and the third stack ST3.

The first stack ST1 may include an electron injection layer EIL, a first electron transport layer ETL1, a first organic emissive layer EML1, a first electron blocking layer EBL1, and a first hole transport layer HTL1. The second stack ST2 may include a second electron transport layer ETL2, a second organic emissive layer EML2, a second electron blocking layer EBL2 and a second hole transport layer HTL2. The third stack ST3 may include a third electron transport layer ETL3, a third organic emissive layer EML3, a third electron blocking layer EBL3, a third hole transport layer HTL3 and a hole injection layer HIL. The functions and configurations of the layers have been described above.

The first charge generation layer CGL1 may include a first n-type charge generation layer N-CGL1 and a first p-type charge generation layer P-CGL1. The first n-type charge generation layer N-CGL1 may be in contact with the second electron transport layer ETL2. The first p-type charge generation layer P-CGL1 may be disposed between the first n-type charge generation layer N-CGL1 and the first hole transport layer HTL1.

The second charge generation layer CGL2 may include a second n-type charge generation layer N-CGL2 and a second p-type charge generation layer P-CGL2. The second n-type charge generation layer N-CGL2 may be in contact with the third electron transport layer ETL3. The second p-type charge generation layer P-CGL2 may be disposed between the second n-type charge generation layer N-CGL2 and the second hole transport layer HTL2. The functions and configurations of the first and second charge generation layers CGL1 and CGL2 are identical to those described above.

The first organic emissive layer EML1 and the third organic emissive layer EML3 may be red-green organic emissive layers, and the wavelength range of the light emitted from the first organic emissive layer EML1 and the third organic emissive layer EML3 may range from approximately 520 nm to 580 nm. In addition, the second organic emissive layer EML2 is a sky blue emissive layer, and the wavelength range of the light emitted from the second organic emissive layer EML2 may range from approximately 450 nm to 480 nm.

As described above, when electric current is applied between the anode 216 and the cathode 226, electrons are injected into the organic layer 230 from the cathode 226 while holes are injected from the anode 216 into the organic layer 230. Thereafter, excitons are generated in the organic layer 230. As the excitons decay, light is generated, which is equal to the energy difference between the lowest unoccupied molecular orbital (LUMO) and the highest occupied molecular orbital (HOMO).

The light generated in the organic layer 230 may travel upward (top-emission) or downward (bottom-emission) depending on the transmittance and reflectance of the conductive layer 213, the anode 216 and the cathode 226.

For example, when conductive layer 213 and the anode 216 are transparent electrodes while the cathode 226 is a reflective electrode, the light generated in the organic layer 230 is reflected by the cathode 226 to be transmitted through the conductive layer 213 and the anode 216, such that the light exits through the bottom of the organic light-emitting diode unit 101. That is to say, the organic light-emitting diode unit is of the bottom-emission type. It is, however, to be understood that the present disclosure is not limited thereto. When the conductive layer 213 and anode 216 are reflective electrodes while the cathode 226 is a transparent electrode, the organic light-emitting diode unit 101 may be of the top-emission type.

Referring back to FIGS. 5A to 5C and FIG. 6, the conductive layer 213 according to the second exemplary aspect of the present disclosure may also serve as an inner light extracting layer. Accordingly, the buffer layer 240 may be disposed under the conductive layer 213. The buffer layer 240 may block moisture and air permeating through the substrate 210. To this end, the buffer layer 240 may be made up of a single layer of an inorganic material such as silicon oxide (SiOx) and silicon nitride (SiNx). If necessary, the buffer layer 240 may be made up of a composite layer of an inorganic material and an organic material.

For example, the roughness of the surface of the conductive layer 213 in contact with the buffer layer 240 may be increases, thereby increasing the efficiency of extracting light generated from the organic light-emitting diode to the outside. It is, however, to be understood that the present disclosure is not limited thereto.

The encapsulation unit may cover the organic light-emitting diode unit 101 and block external influences to protect the organic light-emitting diode unit 101. The encapsulation unit 102 may include an adhesive layer 260 in contact with the cathode 226, a metal film 270 in contact with the adhesive layer 260 and a protective film 275 attached to the metal film 270.

The adhesive layer 260 may be implemented as a pressure sensitive adhesive (PSA) for attaching the metal film 270 to the organic light-emitting diode unit 200. The thickness of the adhesive layer 260 may be approximately 30 μm. It is, however, to be understood that the present disclosure is not limited thereto, and the thickness may vary depending on the design choice of the lighting apparatus 100.

The metal film 270 is disposed on the adhesive layer 260 and serves to maintain the rigidity of the lighting apparatus 200. To this end, the metal film 270 may be formed of copper (Cu) having a thickness of approximately 20 μm. It is, however, to be understood that the present disclosure is not limited thereto, but the thickness may vary depending on the design choice of the lighting apparatus 200.

The protective film 275 may be disposed on the metal film 270 to absorb external impact to protect the lighting apparatus 200. To this end, the protective film 275 may be implemented as a polyethylene terephthalate (PET) having a thickness of approximately 100 μm, which is a polymer film. It is, however, to be understood that the present disclosure is not limited thereto, but the protective film 175 may be modified depending on the design choice of the lighting apparatus 200.

Incidentally, according to the second exemplary aspect of the present disclosure, even if a short-circuit occurs between the anode 216 and the cathode 226 due to particles, the conductive layer 213 having a high resistance is formed on the entire surface of the substrate 210, so that it is possible to prevent a short-circuit in the entire panel.

That is to say, the conductive layer 213 having a high resistance is formed on the entire surface of the substrate 210, such that the resistance is added to the entire panel, thereby limiting current flowing to a short-circuit.

Figure 8:
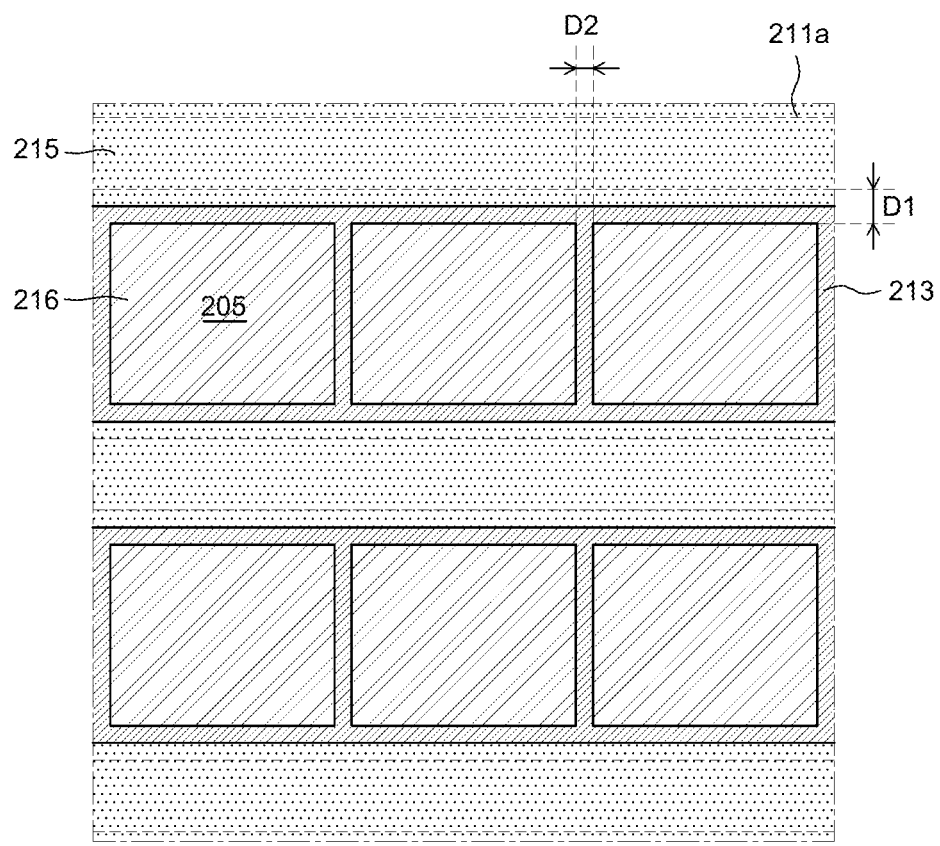
FIG. 8 is a view showing a part of an emission area in the lighting apparatus using organic light-emitting diodes according to the second exemplary aspect shown in FIG. 5A.

FIG. 8 is a view showing a part of an emission area in the lighting apparatus using organic light-emitting diodes according to the second exemplary aspect shown in FIG. 5A.

Referring to FIG. 8, in the lighting apparatus 200 according to the second exemplary aspect, auxiliary lines are formed in a line shape instead of a lattice shape, and a high-resistance conductive layer is formed on the entire surface of the substrate to replace the function of the short-circuit reduction pattern. By doing so, the aperture ratio can be improved.

In addition, in the lighting apparatus 200 according to the second exemplary aspect of the present disclosure, an island-shaped anode 216 is additionally formed in the emission zone 205 that is not covered by the passivation layer 215 to reduce the resistance, thereby preventing the luminance from being lowered by the conductive layer 213 having a high resistance. By forming the anode 216 in the island-shape, when a short-circuit occurs in a pixel due to particles, only the pixel goes out.

That is to say, the anode 216 is disposed in each of the pixels between the first auxiliary lines 211a in an island shape, and may be made of a conductive material having a lower resistance than that of the conductive layer 213.

The conductive layer 213 having a high resistance between the first auxiliary lines 211a and the anode 216 may serve as a current path, so that a short-circuit reduction pattern can be omitted. Therefore, the aperture ratio can be increased by the width of the short-circuit reduction pattern.

In addition, since the vertical auxiliary line is removed between the island-shaped anodes 216, the aperture ratio can be increased by the width of the vertical auxiliary line.

As a result, it can be seen that the aperture ratio is improved to approximately 95.3% by approximately 13.4% more or less compared to that of the first exemplary aspect, i.e., approximately 81.9%.

For example, the distance D2 between the island-shaped anodes 216 may be reduced to 4 μm or less. However, in order to implement the short-circuit reduction pattern, the distance D1 between the first auxiliary line 211a and the anode 216 may be larger than the distance D2. It is, however, to be understood that the present disclosure is not limited thereto.

As described above, by employing the high-resistance conductive layer 213, the short-circuit reduction pattern as well as the vertical auxiliary line can be eliminated, the emission zone 205 is increased, thereby preventing the luminance from being lowered.

In addition, according to the exemplary aspect of the present disclosure, by increasing the aperture ratio, the lifetime of the lighting apparatus can be improved.

Referring back to FIGS. 1 to 8, the anode 216 thus formed may be extended to the first pad area PA1 on one outer side of the emission area to form a first pad electrode 227. A second pad electrode 228 electrically insulated from the anode 216 may be formed in the second pad area PA2. That is to say, the second pad electrode 228 may be disposed in the same layer as the anode 216 and may be spaced apart and electrically isolated from the anode 216. In addition, the first conductive layer 213a under the first pad electrode 227 and the second conductive layer 213b under the second pad electrode 228 may also be electrically insulated from each other.

For example, in FIGS. 5A to 5C, the first conductive layer 213a may be formed generally in a rectangular shape, with the upper center portion removed to form a recession, and the second conductive layer 213b may be disposed in the recession. It is, however, to be understood that the present disclosure is not limited thereto.

The auxiliary lines 211 and the first auxiliary pad electrode 217 are disposed in the emission area EA and the first pad area PA1 of the substrate 210, respectively, and the auxiliary lines 211 and the first auxiliary pad electrode 217 can be electrically connected to each other through the first conductive layer 213a and the connection lines 219.

The anode 216 and the conductive layer 213 are made of a transparent conductive material and have the advantage of transmitting emitted light, but have the disadvantage of high electrical resistance as compared with opaque metal. Therefore, when the lighting apparatus 200 having a large area is fabricated, the current applied to the wide emission area is not evenly distributed due to the relatively large resistance, and such uneven current distribution makes the luminance of the light from the lighting apparatus 200 ununiform.

In order to overcome this, a plurality of first auxiliary lines 211a made of an opaque conductive material is disposed in a line shape over the entire emission area EA, and a vertical second auxiliary lines 211b is disposed at both ends thereof. Thus, uniform current is applied to the anode 216 of the entire emission zone 205 of the emission area EA, allowing the lighting apparatus 200 having a larger area to emit light of uniform luminance.

The auxiliary lines 211 may be made of a metal having good conductivity such as Al, Au, Cu, Ti, W and Mo, or an alloy thereof. The auxiliary lines 211 may have a two-layer structure of an upper auxiliary lines and a lower auxiliary line. However, the present disclosure is not limited thereto. It may be made up of a single layer.

The passivation layer 215 may be stacked in the emission area EA and a part of the pad areas PA1 and PA2 of the substrate 210. The passivation layer 215 may be removed in the emission zone 205 so that it is formed in a line shape to cover the auxiliary lines 211 arranged in a line shape. It is, however, to be understood that the present disclosure is not limited thereto.

The passivation layer 215 disposed in the emission area EA may cover the auxiliary lines 211 and may maintain a predetermined distance with the anode 216. In particular, the passivation layer 215 in the emission area EA surrounds the auxiliary lines 211 to reduce the level difference by the auxiliary lines 211, so that various layers to be formed in subsequent processes can be reliably formed without being broken.

The passivation layer 215 may be made of an inorganic material such as SiOx and SiNx. However, the passivation layer 215 may be made of an organic material such as photo acryl or may be made up of multiple layers of an inorganic material and an organic material.

The organic layer 230 and the cathode 226 may be disposed on the anode 216 and the passivation layer 215 disposed on the substrate 210. A part of the passivation layer 215 on the second pad electrode 228 located in the emission area EA may be removed, such that a contact hole 214 for exposing the second pad electrode 228 may be formed. The cathode 226 may be electrically connected to the second pad electrode 228 thereunder through the contact hole 214.

Since the passivation layer 215 is disposed on the auxiliary lines 211 in the emission area EA, the organic layer 230 above the auxiliary lines 211 is not in contact with the auxiliary lines 211, such that no organic light-emitting diode is formed above the auxiliary lines 211. In other words, in the emission area EA, the organic light-emitting diode is formed only in the emission zone 205 in a generally rectangular shape between the auxiliary lines 211 in a line shape, for example.

Although not shown in the drawings, a second passivation layer and a third passivation layer may be disposed on the substrate 210 on which the cathode 226 is formed.

The second passivation layer is formed to cover the organic layer 230 and the cathode 226 in the emission area EA and may prevent moisture from permeating into the organic layer 230 in the emission area EA.

In other words, according to the exemplary aspect of the present disclosure, the second passivation layer and the third passivation layer are formed so as to cover the organic layer 230 and the cathode 226 in the emission area EA in addition to the adhesive layer 260 and the sealing means of the metal film 270, so that it is possible to prevent moisture from permeating into the organic layer 230 of the lighting apparatus 200 in which light is actually emitted and output.

The second passivation layer may be made of an organic material such as photo acryl. The third passivation layer may be made of an inorganic material such as SiOx and SiNx. It is, however, to be understood that the present disclosure is not limited thereto.

An encapsulant may be disposed on the third passivation layer. Such an encapsulant may include an epoxy compound, an acrylate compound, an acrylic compound, or the like.

As described above, in the first pad area PA1 of the substrate 210, the first pad electrode 227 electrically connected to the anode 216 may be exposed to the outside through the first open hole OP1. In the second pad area PA2 of the substrate 210, the second pad electrode 228 electrically connected to the cathode 226 through the contact hole 214 may be exposed to the outside through the second open hole OP2. Accordingly, the first pad electrode 227 and the second pad electrode 228 are electrically connected to an external power source to apply current to the anode 216 and the cathode 226, respectively.

The adhesive layer 260 such as a pressure-sensitive adhesive (PSA) may be disposed on the third passivation layer, and the metal film 270 may be disposed on the adhesive layer 260 so that the metal film 270 is attached to the third passivation layer. As a result, the lighting apparatus 200 can be sealed.

The adhesive layer 260 and the sealing means of the metal film 270 can be attached so that the second and third passivation layers are covered sufficiently.

In addition, the metal film 270 may be attached to the entire surface of the emission area EA of the substrate 210 except for the pad areas PA1 and PA2.

The adhesive layer 260 may be formed of a photo-curable adhesive or a thermosetting adhesive.

Although the anodes 216 each in the respective pixels have substantially the same size in the lighting apparatus 200 according to the second exemplary aspect of the present disclosure, the present disclosure is not limited thereto. According to the third exemplary aspect of the present disclosure, different pixels may have different sizes of anodes or distances between the anode and auxiliary lines. The third exemplary aspect of the present disclosure will be described below.

A lighting apparatus according to the third exemplary aspect of the present disclosure is substantially identical to the lighting apparatus according to the second exemplary aspect except for the size of an anode; and, therefore, the redundant description will be omitted.

Figure 9:
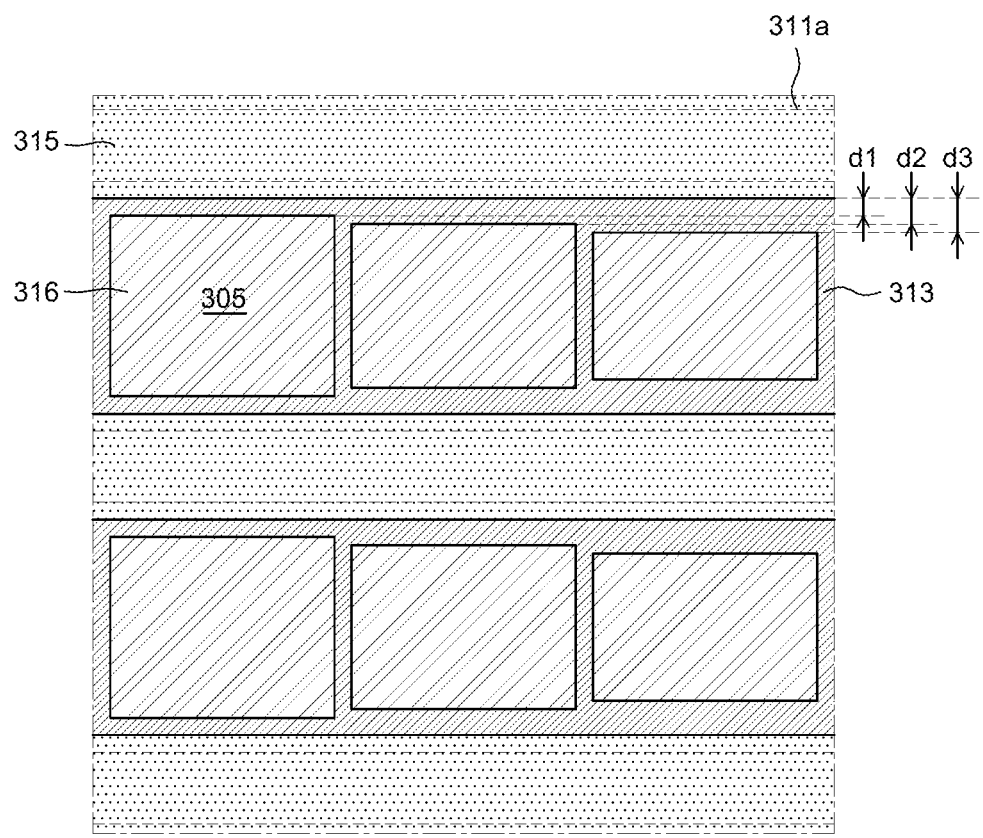
FIG. 9 is a plan view showing a part of an emission area in the lighting apparatus using organic light-emitting diodes according to the third exemplary aspect of the present disclosure.

FIG. 9 is a plan view showing a part of an emission area in the lighting apparatus using organic light-emitting diodes according to the third exemplary aspect of the present disclosure.

Referring to FIG. 9, in the lighting apparatus according to the third exemplary aspect, first auxiliary lines 311a are formed in a line shape instead of a lattice shape, and a high-resistance conductive layer 313 is formed to replace the function of the short-circuit reduction pattern, like in the second exemplary aspect described above. By doing so, the aperture ratio can be improved.

In addition, in the lighting apparatus according to the third exemplary aspect of the present disclosure, an island-shaped anode 316 is additionally formed in an emission zone 305 that is not covered by a passivation layer 315 to reduce the resistance, thereby preventing the luminance from being lowered by the conductive layer having a high resistance. By forming the anode 316 in the island-shape, when a short-circuit occurs in a pixel due to particles, only the pixel goes out.

The conductive layer 313 having a high resistance between the first auxiliary lines 311a and the anode 316 may serve as a current path, so that a short-circuit reduction pattern can be formed. Therefore, the aperture ratio can be increased by the width of the short-circuit reduction pattern.

In addition, since the vertical auxiliary line is removed between the island-shaped anodes 316, the aperture ratio can be increased by the width of the vertical auxiliary line.

For example, the distance D2 between the island-shaped anodes 316 may be reduced to 4 µm or less. However, in order to implement the short-circuit reduction pattern, the distances d1, d2 and d3 between the first auxiliary lines 311a and the anode 316 may be larger than the distance D2. It is, however, to be understood that the present disclosure is not limited thereto.

As described above, by employing the high-resistance conductive layer 313, the short-circuit reduction pattern as well as the vertical auxiliary line can be eliminated, the emission zone 305 is increased, thereby preventing the luminance from being lowered.

In addition, according to the exemplary aspect of the present disclosure, by increasing the aperture ratio, the lifetime of the lighting apparatus can be elongated.

In addition, according to the third exemplary aspect of the present disclosure, different pixels have different distances between the first auxiliary lines 311a and the anode 316, i.e., different sizes of the anode 316, thereby canceling the current difference caused by the locations of pixels in the panel. Although the distances d1, d2 and d3 between the first auxiliary lines 311a and the anode 316 become larger from a side to the other side of the panel in the example shown in FIG. 9, the present disclosure is not limited thereto.

As described above, according to the exemplary aspects of the present disclosure, luminance uniformity is compensated by connecting the first pad electrode with the auxiliary lines 311a through a plurality of connection lines to supply a current from above, below, left and right sides. However, there may also be a slight difference in current between pixels in a row (and/or between pixels in different columns). For example, the pixels located on the left and right sides in a row are closer to the connection lines than the pixels located in the center and accordingly less affected by a current drop. Therefore, in order to increase the luminance uniformity, the distance between the first auxiliary line 311a and the anode 315 may become larger from the pixels located in the center to the pixels located on the left and right edges. The distance between the first auxiliary line 311a and the anode 316 may increase gradually.

Hereinafter, a method of fabricating a lighting apparatus according to the second exemplary aspect of the present disclosure will be described in detail with reference to the drawings. Since the lighting apparatus according to the third exemplary aspect of the present disclosure is substantially identical to the lighting apparatus according to the second exemplary aspect of the present disclosure except for the size of the anode, the method of fabricating the lighting apparatus according to the second exemplary aspect can be equally applied for fabricating the lighting apparatus according to the third exemplary aspect.

FIGS. 10A to 10F are plan views for illustrating a method of fabricating the lighting apparatus using organic light-emitting diodes according to the second exemplary aspect shown in FIG. 5A.

FIGS. 11A to 11F are cross-sectional views for sequentially illustrating a method of fabricating the lighting apparatus using organic light-emitting diodes according to the second exemplary aspect shown in FIG. 6.

Figure 10A:
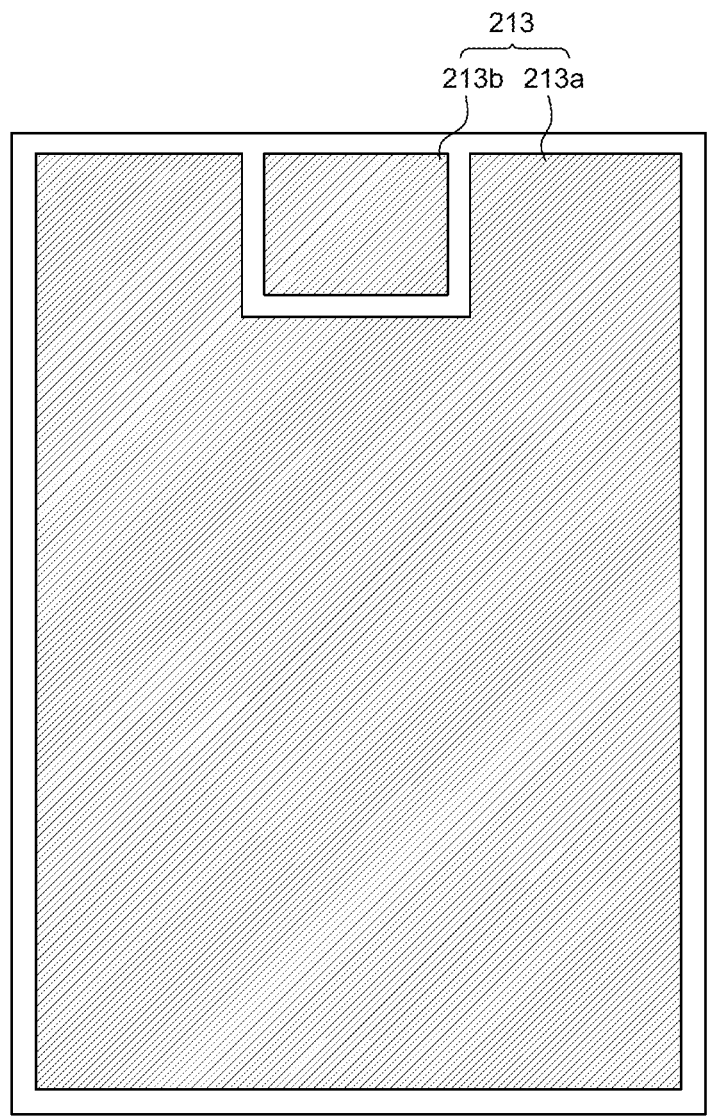
FIGS. 10A to 10F are plan views for illustrating a method of fabricating the lighting apparatus using organic light-emitting diodes according to the second exemplary aspect shown in FIG. 5A.
Figure 11A:
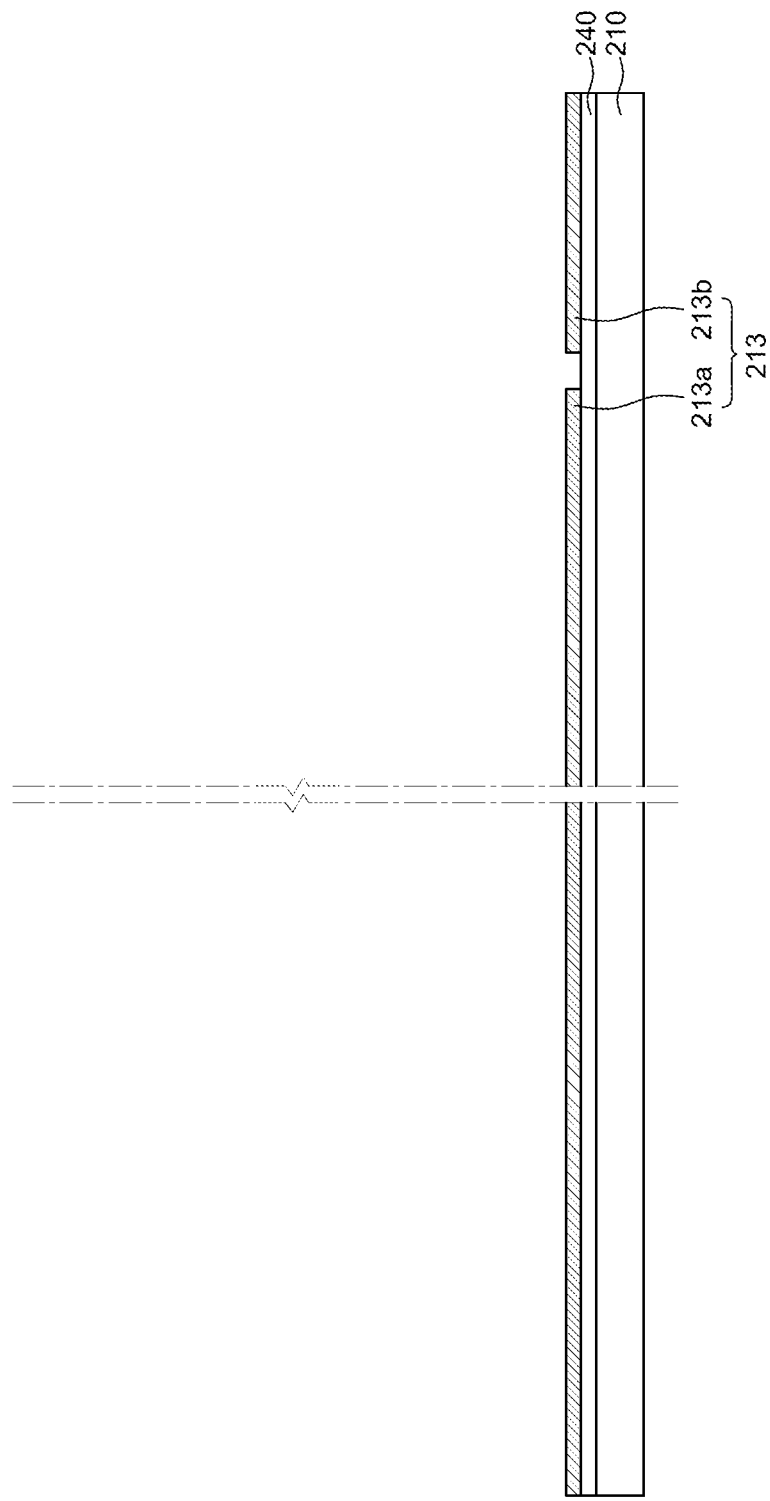
FIGS. 11A to 11F are cross-sectional views for sequentially illustrating a method of fabricating the lighting apparatus using organic light-emitting diodes according to the second exemplary aspect shown in FIG. 6.

Referring to FIGS. 10A and 11A, a buffer layer 240 may be formed on the entire surface of a substrate 210 including an emission area and pad areas. It is, however, to be understood that the present disclosure is not limited thereto, and the buffer layer 240 may be eliminated.

The substrate 210 may be made of transparent glass. In addition, the substrate 210 may be made of a polymer material having flexibility.

The buffer layer 240 may block moisture and air permeating through the substrate 210. The buffer layer 240 may be made up of a single layer of an inorganic material such as silicon oxide (SiOx) and silicon nitride (SiNx). If necessary, the buffer layer 240 may be made up of a composite layer of an inorganic material and an organic material.

Subsequently, a conductive layer 213 may be formed on the buffer layer 240 formed on the substrate 210.

The conductive layer 213 may be made of a transparent conductive material having a high resistance of approximately 104 to 105 Ω/□.

The conductive layer 213 may include a first conductive layer 213a disposed in the emission area and the first pad area, and a second conductive layer 213b disposed on the second pad area. The first conductive layer 213a and the second conductive layer 213b may be separated from each other in the emission area.

For example, the first conductive layer 213a may be formed generally in a rectangular shape, with the upper center portion removed to form a recession, and the second conductive layer 213b may be disposed in the recession. It is, however, to be understood that the present disclosure is not limited thereto.

By virtue of the conductive layer 213 having a high resistance, it is possible to limit the current flowing to a short-circuit, such that it is possible to remove a short-circuit reduction pattern.

For example, the roughness of the surface of the conductive layer 213 in contact with the buffer layer 240 may be increases, thereby increasing the efficiency of extracting light generated from the organic light-emitting diode to the outside. In such case, the conductive layer 213 according to the second exemplary aspect may serve as an inner light extraction layer. It is, however, to be understood that the present disclosure is not limited thereto.

Figure 10B:
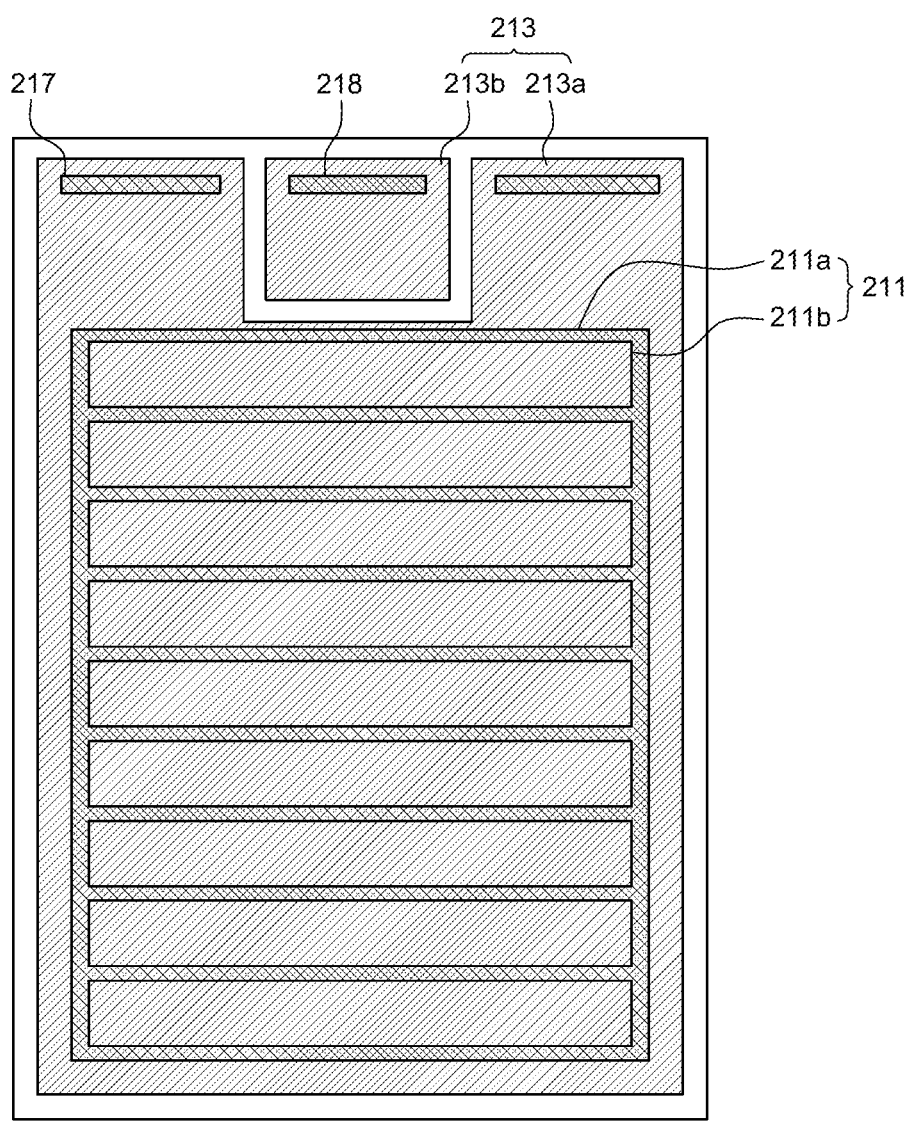
Figure 11B:
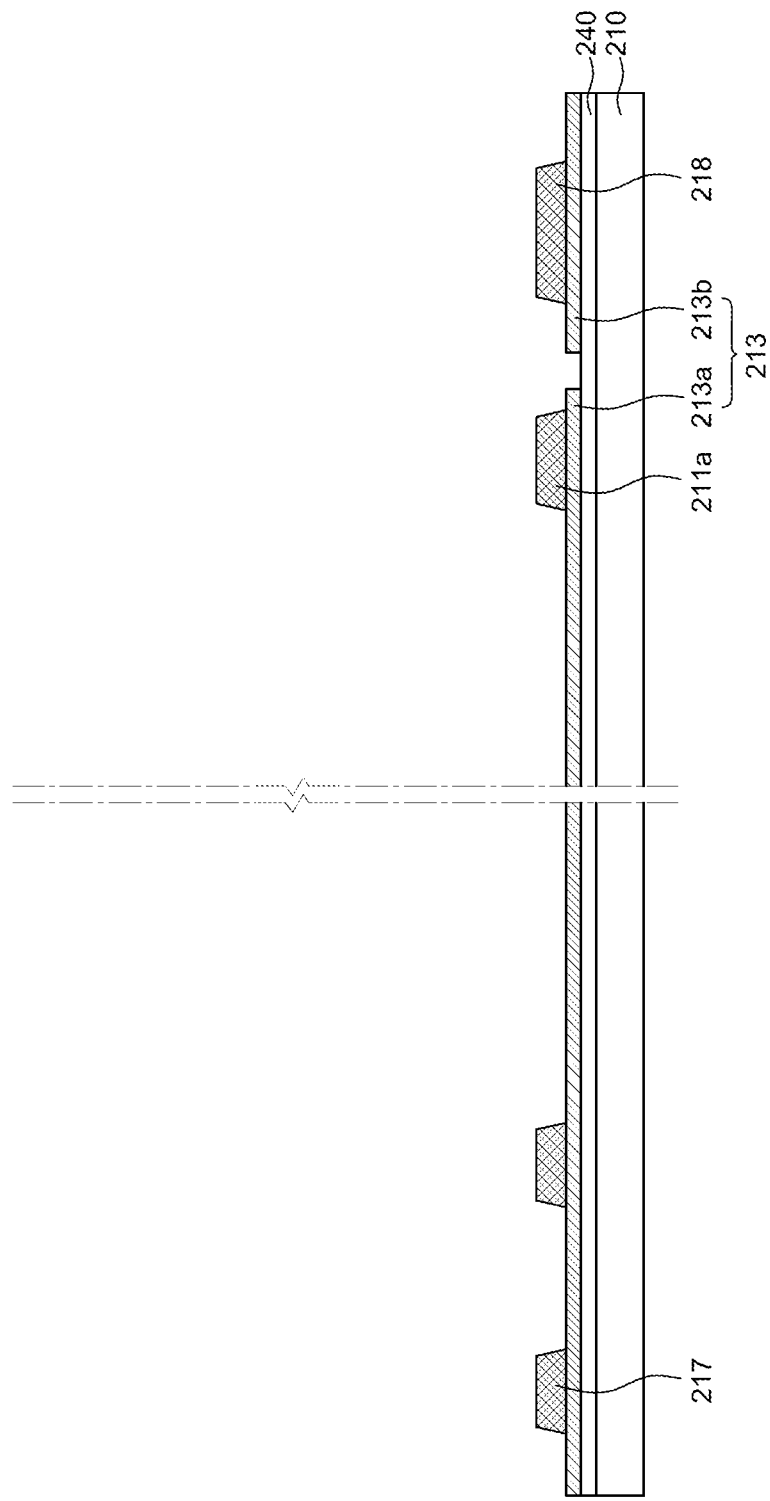

Subsequently, referring to FIGS. 10B and 11B, a metal such as Al, Au, Cu, Ti, W and Mo or an alloy thereof is deposited on the conductive layer 213 and etching is performed. By doing so, auxiliary lines 211 and the first and second auxiliary pad electrodes 217 and 218 may be formed in the emission area and the first and second pad areas as either a single layer or a plurality of layers.

For example, the auxiliary lines 211 may include a plurality of first auxiliary lines 211a in the horizontal direction and a second auxiliary line 211b in the vertical direction connecting between the ends of the first auxiliary lines 211a. It is, however, to be understood that the present disclosure is not limited thereto. The auxiliary lines 211 according to some exemplary aspects of the present disclosure may not include the second auxiliary line 211b.

As such, according to the second exemplary aspect, the first auxiliary lines 211a are formed in a line shape instead of a lattice shape, and a high-resistance conductive layer is formed to replace the function of the short-circuit reduction pattern. By doing so, the aperture ratio can be improved.

A first auxiliary pad electrode 217 and a second auxiliary pad electrode 218 made of the same material as the auxiliary lines 211 may be formed on the substrate 210 in the first pad area and the second pad area. It is, however, to be understood that the present disclosure is not limited thereto.

Figure 10C:
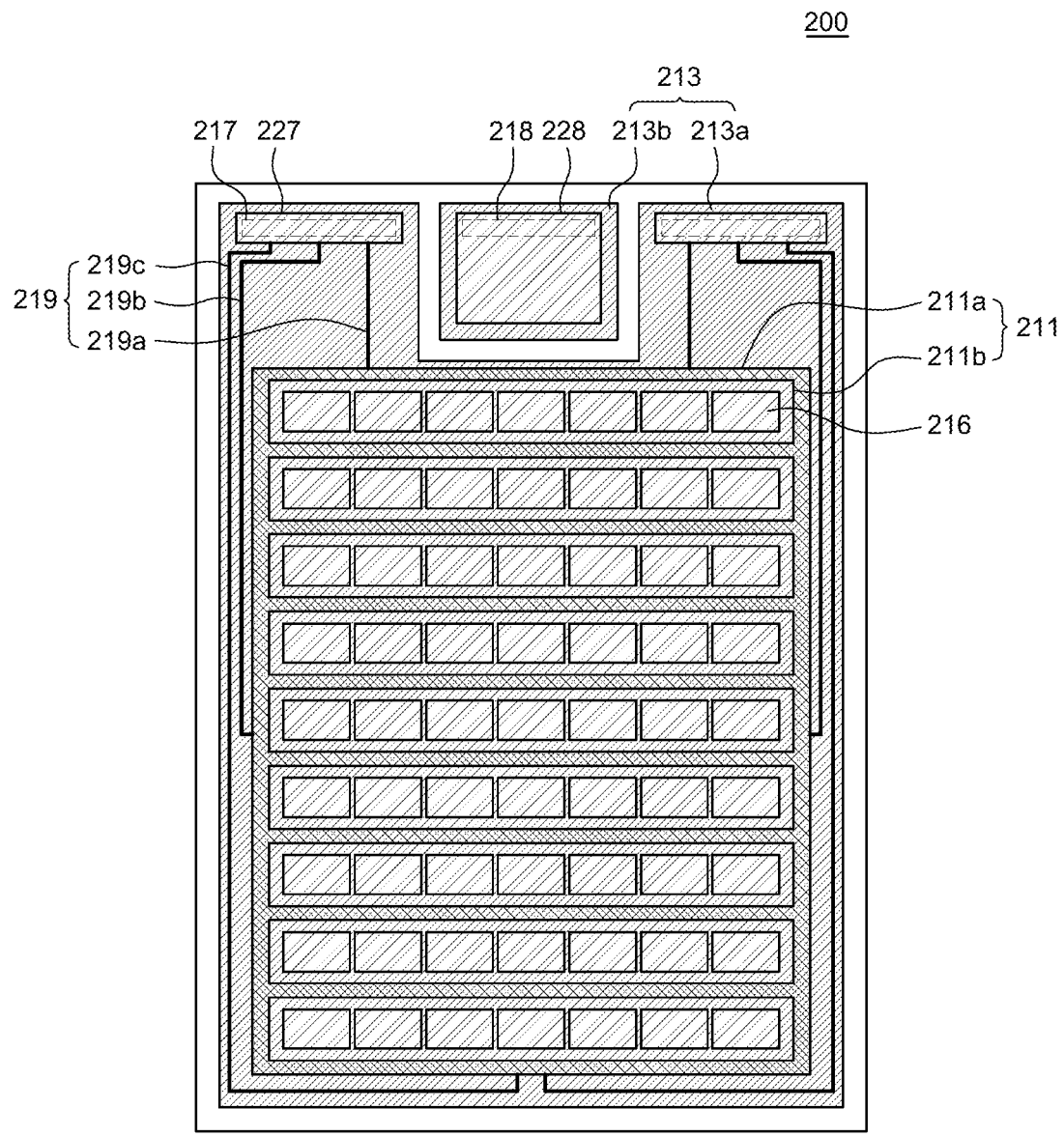
Figure 11C:
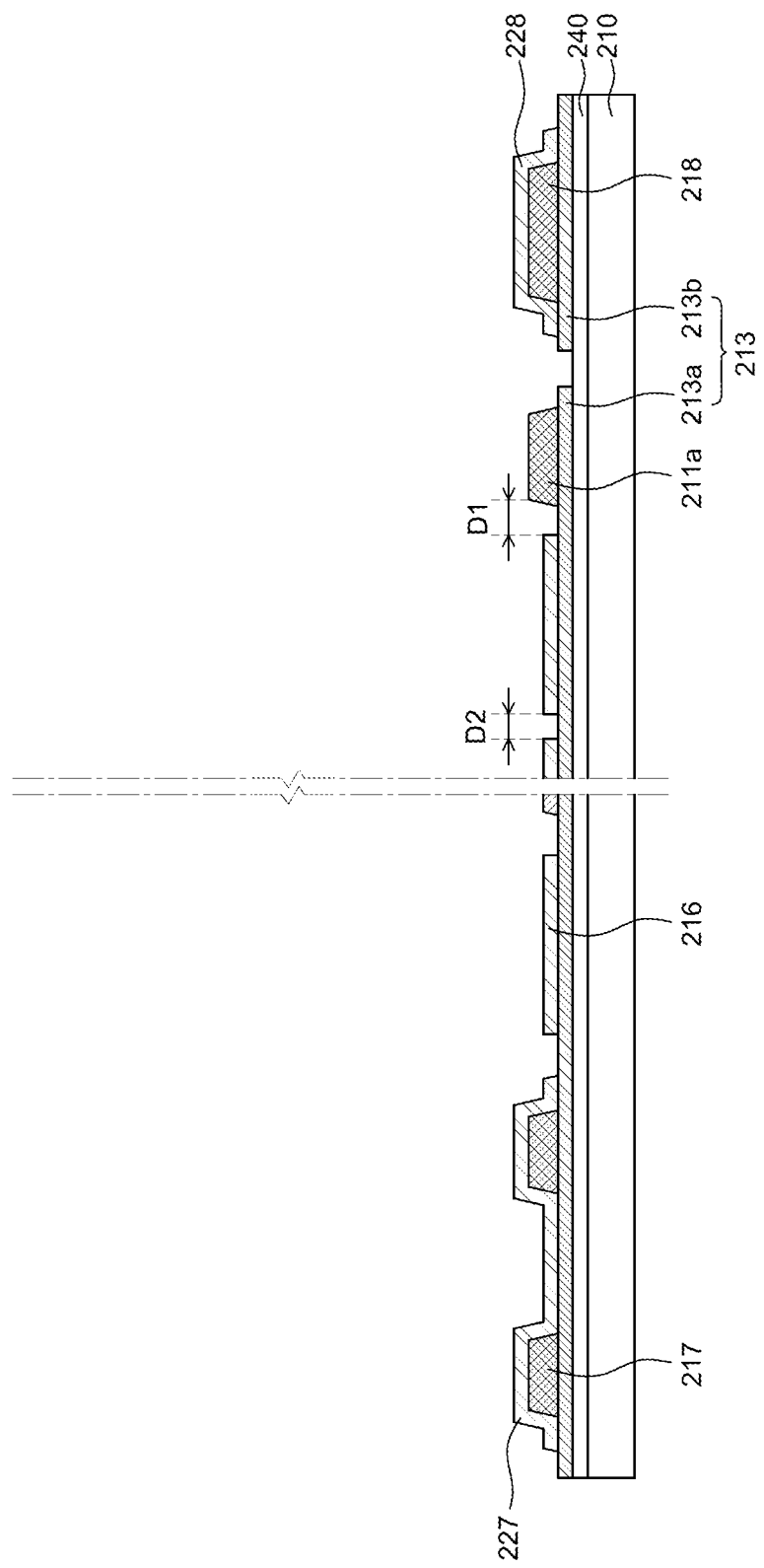

Next, referring to FIGS. 10C and 11C, a transparent low-resistance conductive layer is stacked on the entire substrate 210.

Subsequently, a transparent low-resistance conductive layer is selectively etched to form an anode 216 and first and second pad electrodes 227 and 228 in the emission area and the first and second pad areas.

The anode 216 may be formed of indium tin oxide (ITO) or indium zinc oxide (IZO), which is a transparent metal oxide material having a high work function and higher conductivity than the conductive layer 213 to facilitate injection of holes into the organic layer.

As an example, the anode 216 may be defined in a rectangular island shape to define the emission zone. It is, however, to be understood that the present disclosure is not limited thereto.

For example, the distance D2 between the island-shaped anodes 216 may be reduced to 4 μm or less. However, in order to implement the short-circuit reduction pattern, the distance D1 between the first auxiliary lines 211a and the anode 216 may be larger than the distance D2. It is, however, to be understood that the present disclosure is not limited thereto.

The anode 216 thus formed may be extended to the first pad area on an outer side of the emission area to form a first pad electrode 227, and a second pad electrode 228 electrically insulated from the anode 216 may be formed in the second pad area. That is to say, the second pad electrode 228 may be disposed in the same layer as the anode 216 and may be spaced apart and electrically isolated from the anode 216. In addition, the first conductive layer 213a under the first pad electrode 227 and the second conductive layer 213b under the second pad electrode 228 may also be electrically insulated from each other.

Although the anodes 216 each disposed in the respective pixels have the same size according to the second exemplary aspect, the present disclosure is not limited thereto. In some implementations, the size of the anodes or the distance between the anodes and the auxiliary lines may be different from pixel to pixel.

In addition, a plurality of connection lines 219; 219a, 219b and 219c may be disposed on the edges thereof, along with the first and second pad electrodes 227 and 228, such that the first pad electrode 227 is connected to the auxiliary lines 211 and thus current is supplied vertically and horizontally to supplement the luminance uniformity. For example, the connection lines 219; 219a, 219b and 219c may include a first connection line 219a for connecting between the first auxiliary lines 211a on the upper side and the first pad electrode 227 to supply a current from above, a second connection line 219b for connecting between the second auxiliary lines 211b on the left and right sides and the first pad electrode 227 to supply a current from the left and right, and a third connection line 219c for connecting between the first auxiliary lines 211a on the lower side and the first pad electrode 227 to supply a current from below.

The connection lines 219; 219a, 219b and 219c may be formed on the first conductive layer 213a.

The connection lines 219; 219a, 219b and 219c may be made of the same material and in the same layer as the anode 216. It is, however, to be understood that the present disclosure is not limited thereto.

Figure 10D:
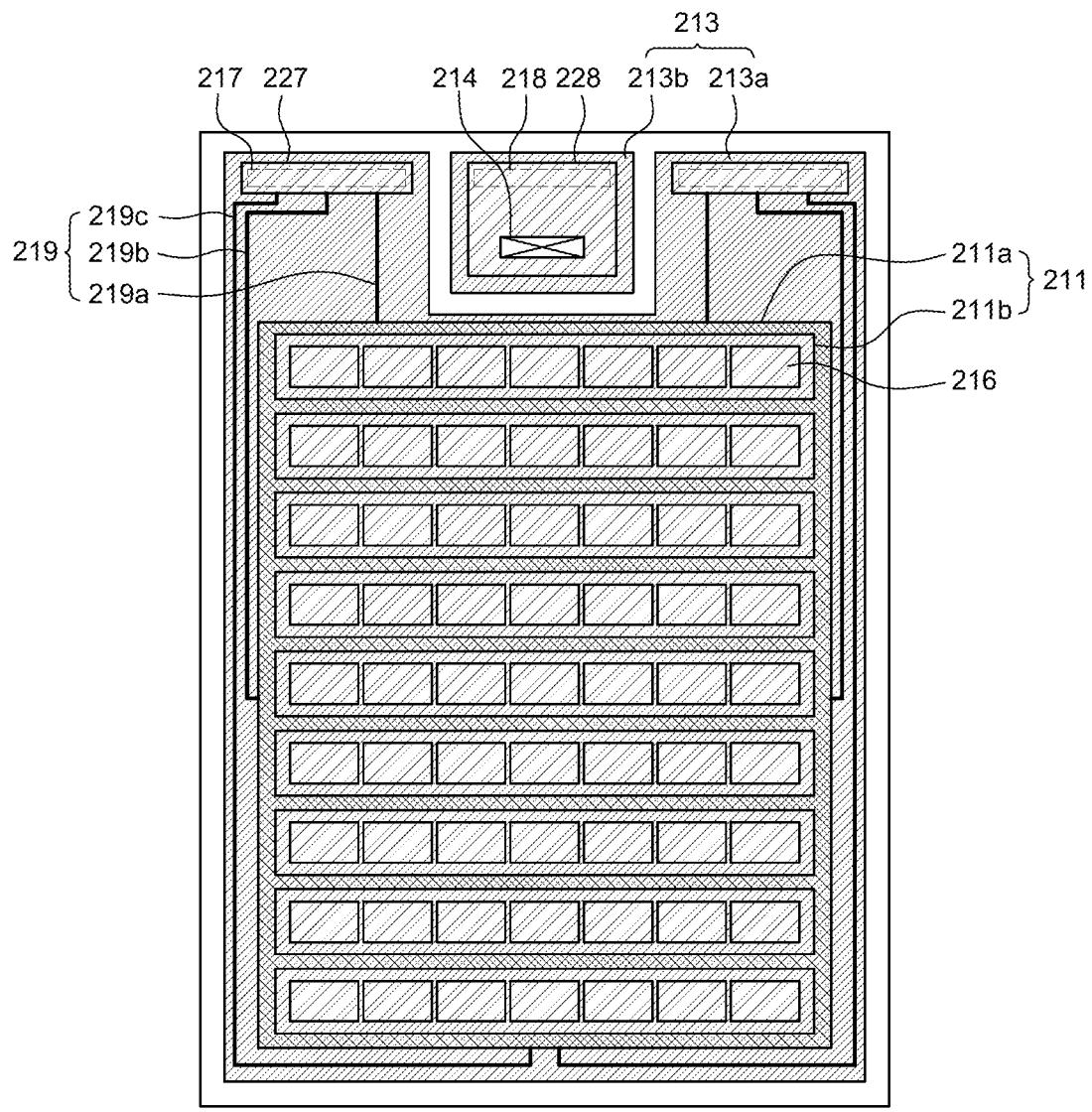
Figure 11D:
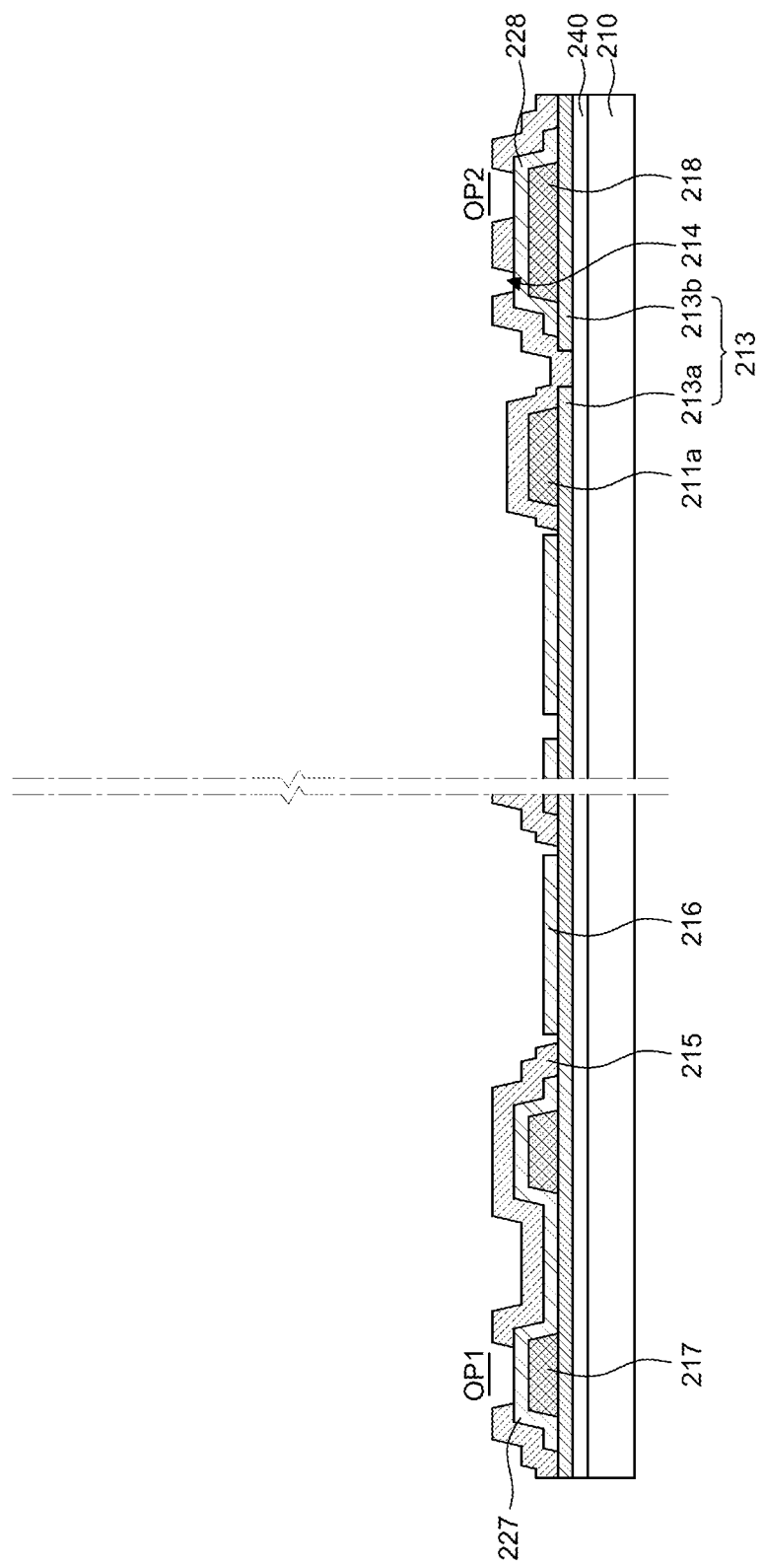

Subsequently, referring to FIG. 10D and FIG. 11D, an inorganic material such as SiNx and SiOx or an organic material such as photo acryl is disposed on the entire substrate 210.

Subsequently, the inorganic material or the organic material is etched to form a passivation layer 215 on the upper portion and the side portion of the auxiliary lines 211 in the emission area and the first and second pad areas, and a contact hole 214 for exposing a part of the second pad electrode 228 and first and second open holes OP1 and OP2 that open a part of the first and second pad electrodes 227 and 228 may be formed.

The passivation layer 215 covers the auxiliary lines 211 but is not formed in the emission zone where light actually exits. The passivation layer 215 surrounds the auxiliary lines 211 to reduce the level difference by the auxiliary lines 211, so that various layers to be formed in subsequent processes can be reliably formed without being broken.

Accordingly, in the first pad area PA1 of the substrate 210, the first pad electrode 227 electrically connected to the anode 216 may be exposed to the outside through the first open hole OP1. In the second pad area PA2 of the substrate 210, the second pad electrode 228 electrically connected to the cathode 226 through the contact hole 214 may be exposed to the outside through the second open hole OP2.

Figure 10E:
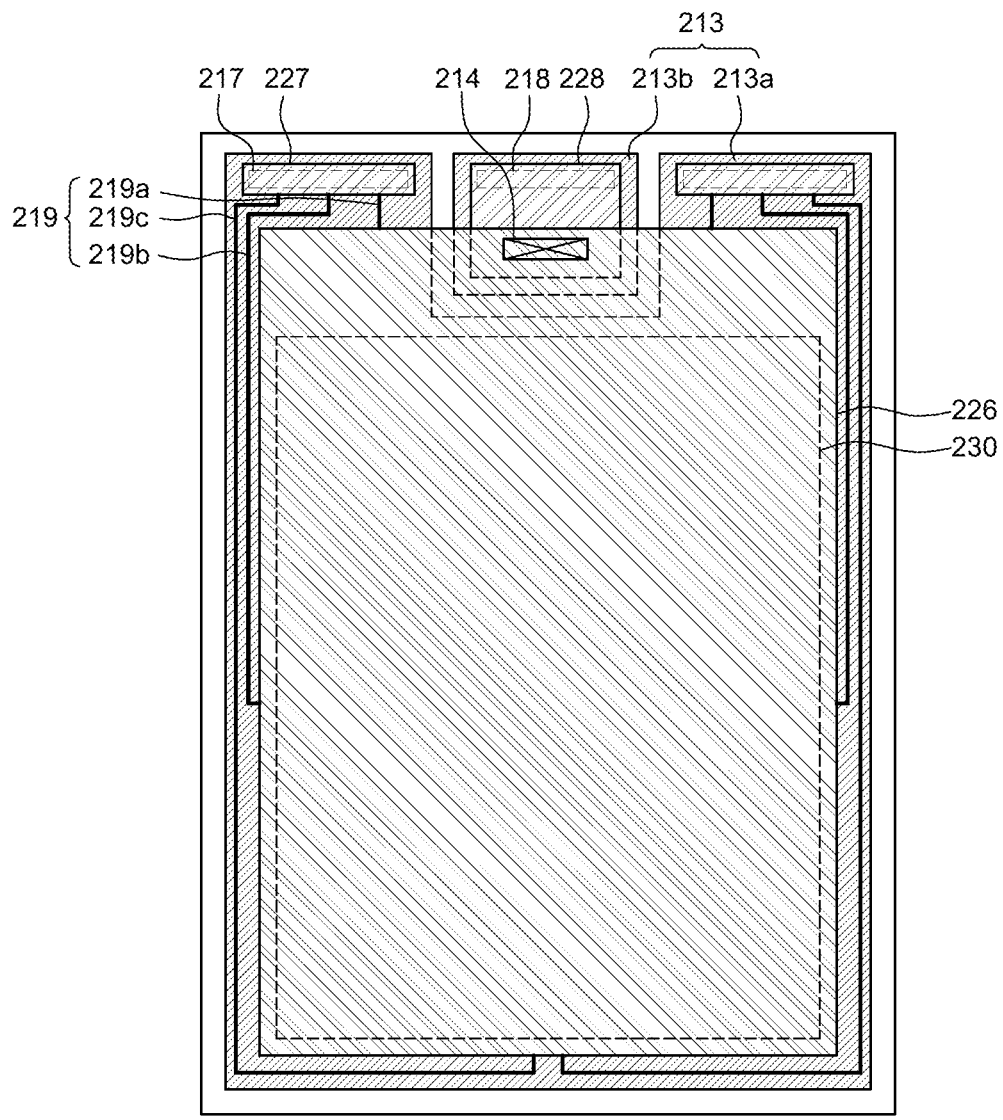
Figure 11E:
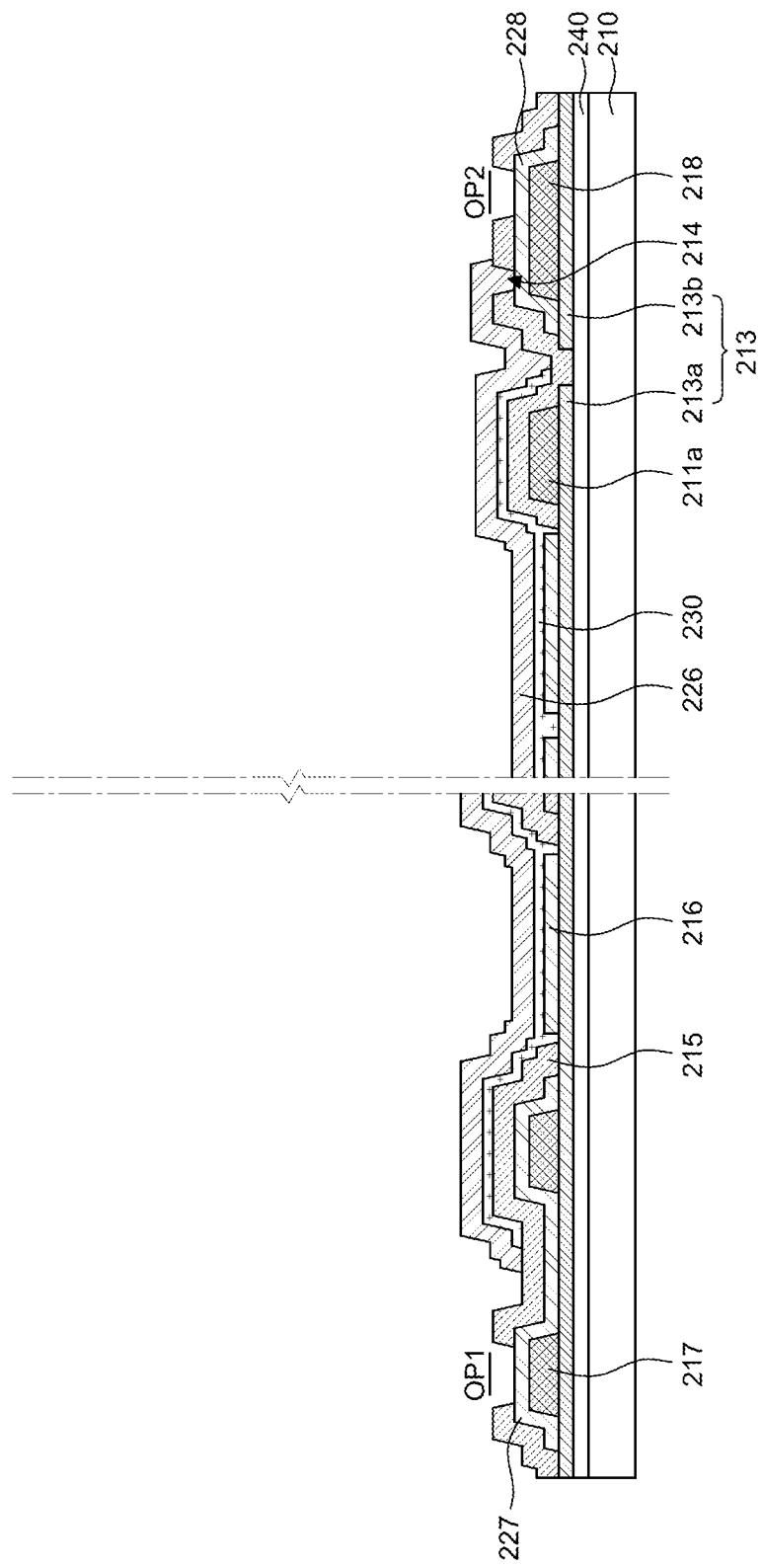

Subsequently, referring to FIGS. 10E and 11E, an organic layer 230 made of an organic material and a cathode 226 made of a metal may be formed in the emission area of the substrate 210.

Specifically, the organic layer 230 made of an organic material may be formed in the emission area of the substrate 210.

The organic layer 230 may be made up of a single stack structure including a red organic emissive layer, a multi-stack tandem structure including a plurality of red organic emissive layers, or a multi-stack tandem structure including red/green organic emissive layers and a sky-blue organic emissive layer. It is, however, to be understood that the organic layer 230 of the present disclosure is not limited to the above-described structure, and various structures may be employed. The organic layer 230 may include an electron injection layer and a hole injection layer for injecting electrons and holes, respectively, into the organic emissive layer, an electron transport layer and a hole transport layer for transporting the injected electrons and holes, respectively, to the organic emissive layer, and a charge generation layer for generating charges such as electrons and holes.

Specifically, the cathode 226 made of a metal may be formed in the emission area of the substrate 210 to cover the organic layer 230.

The cathode 226 may be electrically connected to the second pad electrode 228 thereunder through the contact hole 214.

The cathode 226 may be made of a metal such as magnesium, calcium, sodium, titanium, indium, yttrium, lithium, gadolinium, aluminum, silver, tin and lead or an alloy thereof.

The anode 216, the organic layer 230 and the cathode 226 in the emission area may form an organic light-emitting diode.

Since the passivation layer 215 is disposed on the auxiliary lines 211 in the emission area, the organic light-emitting diode is not formed above the auxiliary lines 211.

Although not shown in the drawings, a second passivation layer made of an organic material may be formed in the emission area of the substrate 210 to cover the organic layer 230 and the cathode 226. It is, however, to be understood that the present disclosure is not limited thereto.

As described above, the second passivation layer is formed to cover the organic layer 230 and the cathode 226 in the emission area and may prevent moisture from permeating into the organic layer 230 in the emission area.

The organic layer 230, the cathode 226 and the second passivation layer may be formed by, but is not limited to, a roll-to-roll equipment via an in-line processing.

Subsequently, a third passivation layer may be formed in the emission area of the substrate 210 to cover the second passivation layer. It is, however, to be understood that the present disclosure is not limited thereto.

The third passivation layer may be formed by another roll-to-roll equipment.

The third passivation layer may be made of an inorganic material such as SiOx and SiNx. It is, however, to be understood that the present disclosure is not limited thereto.

An encapsulant may be further disposed on the third passivation layer. Such an encapsulant may include an epoxy compound, an acrylate compound, an acrylic compound, or the like.

Figure 10F:
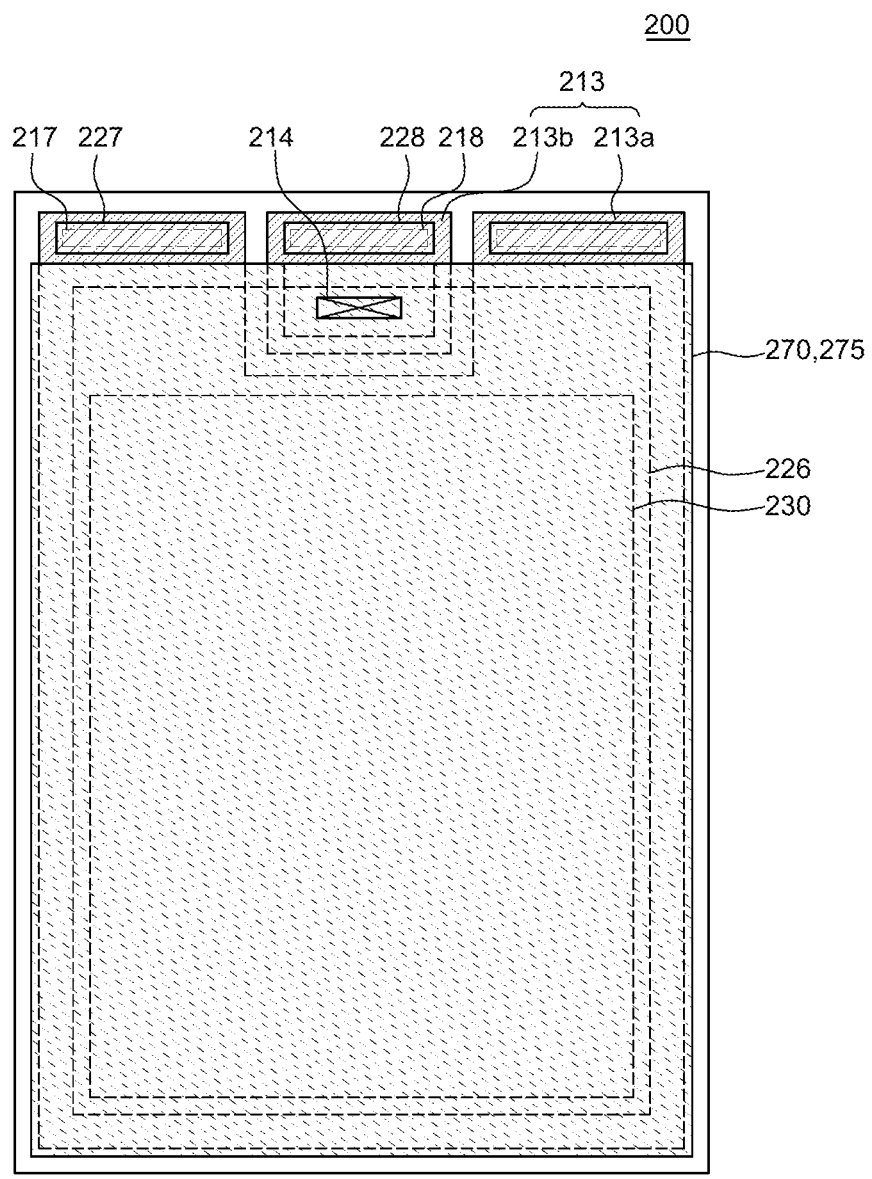
Figure 11F:
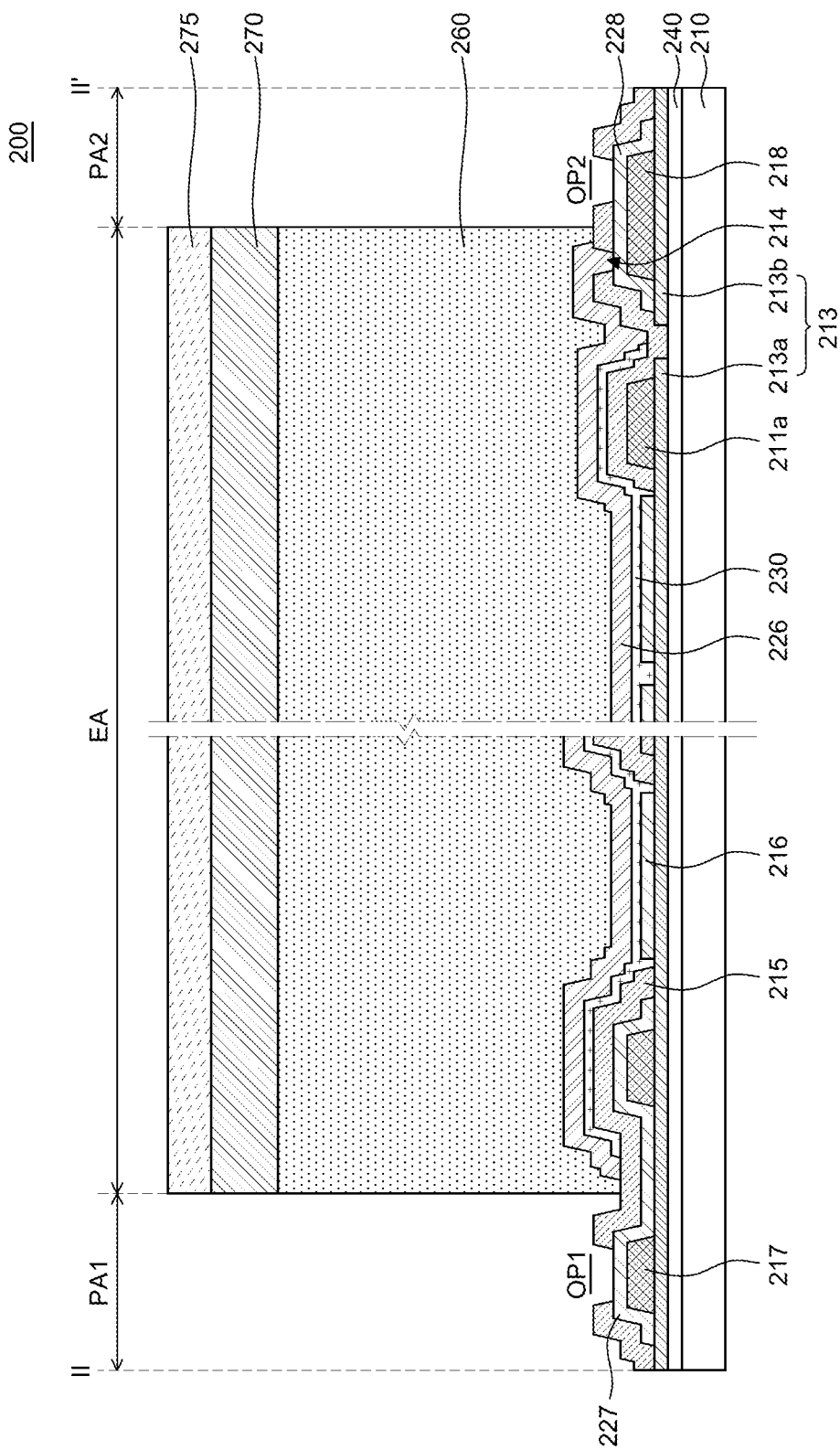

Subsequently, referring to FIGS. 10F and 11F, an adhesive layer 260 may be formed over the substrate 210 in the emission area by applying a photo-curable adhesive or a thermosetting adhesive. Then, the metal film 270 is placed thereon, the adhesive layer 260 is cured so that the metal film 270 is attached thereon.

The first and second pad areas are not covered by the sealing means of the metal film 270, and can be electrically connected to the outside through the first and second pad electrodes 227 and 228.

Subsequently, a protective film 275 may be attached to the entire surface of the substrate 210 in the emission area, excluding the first and second pad areas, thereby completing the lighting apparatus.

The exemplary aspects of the present disclosure can also be described as follows:

According to an aspect of the present disclosure, there is provided a lighting apparatus using organic light-emitting diodes. The lighting apparatus using organic light-emitting diodes includes a conductive layer disposed on a substrate; auxiliary lines arranged on the conductive layer in a line shape; an anode disposed in each of pixels between the auxiliary lines and made of a conductive material having a resistance lower than that of the conductive layer; a passivation layer disposed on the auxiliary lines; an organic layer and a cathode disposed in an emission area of the substrate where the passivation layer is disposed; and a metal film disposed in the emission area of the substrate.

The conductive layer may comprise a first conductive layer disposed in the emission area and a first pad area of the substrate, and a second conductive layer disposed in a second pad area of the substrate, and the first conductive layer may be insulated from the second conductive layer.

The conductive layer may be made of a transparent conductive material having a resistance of approximately 104 to 105 Ω/□.

The auxiliary lines may comprise a plurality of first auxiliary lines arranged in a line shape in a direction, and a second auxiliary line disposed in another direction and connecting ends of the first auxiliary lines with one another.

The lighting apparatus using organic light-emitting diodes may further include a first auxiliary pad electrode disposed in the first pad area; and a second auxiliary pad electrode disposed in the second pad area, wherein the first pad electrode and the second pad electrode may be disposed in a same layer and made of a same material as the auxiliary lines.

The lighting apparatus using organic light-emitting diodes may further include a first pad electrode disposed in the first pad area; and a second pad electrode disposed in the second pad area, wherein the first auxiliary pad electrode and the second auxiliary pad electrode may be disposed in a same layer and made of a same material as the anode.

The first auxiliary pad electrode and the second auxiliary pad electrode may be disposed on the first conductive layer and the second conductive layer, respectively.

The first auxiliary pad electrode and the second auxiliary pad electrode may be disposed under the first pad electrode and the second pad electrode layer, respectively.

The lighting apparatus using organic light-emitting diodes may further include connection lines disposed on the first conductive layer to connect the first pad electrode with the auxiliary lines.

The connection lines may comprise a first connection line for connecting between the first auxiliary lines on the upper side and the first pad electrode to supply a current from above, a second connection line for connecting between the second auxiliary line on the left and right sides and the first pad electrode to supply a current from the left and right sides, and a third connection line for connecting between the first auxiliary lines on the lower side and the first pad electrode to supply a current from below.

The connection lines may be disposed on a same layer and made of a same material as the anode.

The passivation layer may cover the first auxiliary lines and may maintain a predetermined distance with the anode.

A distance between the anode and another anode may be less than a distance between the first auxiliary lines and the anode.

According to another aspect of the present disclosure, there is provided a lighting apparatus using organic light-emitting diodes. The lighting apparatus using organic light-emitting diodes includes a conductive layer disposed on a substrate; auxiliary lines arranged on the conductive layer in a line shape; an anode disposed in each of pixels between the auxiliary lines and made of a conductive material having a resistance lower than that of the conductive layer; a passivation layer disposed on the auxiliary lines; an organic layer and a cathode disposed in an emission area of the substrate where the passivation layer is formed; and a metal film disposed in the emission area of the substrate, wherein a current difference caused by locations of the pixels in a panel is compensated by adjusting a distance between the auxiliary lines and the anode in each of the pixels.

The distance between the auxiliary lines and the anode may become larger from a side to another side of the panel.

The distance between the auxiliary lines and the anode may become larger from pixels located in a central portion toward pixels located on left and right edges, and wherein the distance is gradually increased from the central portion to the left and right edges.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A lighting apparatus using organic light-emitting diodes, comprising:
    a conductive layer disposed on a substrate;
    auxiliary lines arranged on the conductive layer as a line shape;
    a plurality of anodes disposed in respective emission zones between the auxiliary lines and including a conductive material having a resistance lower than that of the conductive layer,
    wherein the plurality of anodes are disposed between the conductive layer and an organic light emitting layer and all bottom surfaces of the plurality of anodes are in direct contact with a top surface of the conductive layer;
    a passivation layer disposed on the auxiliary lines to cover the auxiliary lines and in an emission area except the emission zones;
    the organic light emitting layer and a cathode disposed in the emission area of the substrate,
    wherein an area of the top surface of the conductive layer is larger than that of a top surface of the organic light emitting layer; and
    a metal film disposed in the emission area of the substrate.

2. The apparatus of claim 1, wherein the conductive layer comprises a first conductive layer disposed in the emission area and a first pad area at the substrate, and a second conductive layer disposed in a second pad area at the substrate, and
    wherein the first conductive layer is insulated from the second conductive layer.

3. The apparatus of claim 1, wherein the conductive layer includes a transparent conductive material having a resistance of approximately 104 to 105Ω/□.

4. The apparatus of claim 1, wherein the auxiliary lines comprise a plurality of first auxiliary lines arranged in a direction, and a second auxiliary line disposed in another direction and connected to ends of the first auxiliary lines.

5. The apparatus of claim 2, further comprising a first auxiliary pad electrode disposed in the first pad area and a second auxiliary pad electrode disposed in the second pad area, wherein the first auxiliary pad electrode and the second auxiliary pad electrode are disposed in a same layer and made of a same material as the auxiliary lines.

6. The apparatus of claim 5, further comprising a first pad electrode disposed in the first pad area and a second pad electrode disposed in the second pad area, wherein the first pad electrode and the second pad electrode are disposed in a same layer and made of a same material as the anode.

7. The apparatus of claim 5, wherein the first auxiliary pad electrode and the second auxiliary pad electrode are disposed on the first conductive layer and the second conductive layer, respectively.

8. The apparatus of claim 6, wherein the first auxiliary pad electrode and the second auxiliary pad electrode are disposed under the first pad electrode and the second pad electrode layer, respectively.

9. The apparatus of claim 6, further comprising connection lines disposed on the first conductive layer to connect the first pad electrode with the auxiliary lines.

10. The apparatus of claim 9, wherein the connection lines comprise a first connection line for connecting between the first auxiliary lines on the upper side and the first pad electrode to supply a current from above, a second connection line for connecting between the second auxiliary line on the left and right sides and the first pad electrode to supply a current from the left and right sides, and a third connection line for connecting between the first auxiliary lines under on the lower side and the first pad electrode to supply a current from below.

11. The apparatus of claim 9, wherein the connection lines are disposed on a same layer and made of a same material as the anode.

12. The apparatus of claim 4, wherein the passivation layer covers the first auxiliary lines and maintains a distance with the anode.

13. The apparatus of claim 4, wherein a distance between adjacent anodes is less than a distance between the first auxiliary lines and the anode.

14. A lighting apparatus using organic light-emitting diodes, comprising:
    a conductive layer disposed on a substrate;
    first auxiliary lines arranged in a direction;
    a second auxiliary line disposed between the first auxiliary lines and connected to ends of the first auxiliary lines;
    a plurality of anodes disposed in respective emission zones between the first and second auxiliary lines and including a conductive material having a resistance lower than that of the conductive layer, wherein the plurality of anodes are disposed between the conductive layer and an organic light emitting layer and all bottom surfaces of the plurality of anodes are in direct contact with a top surface of the conductive layer;

a passivation layer disposed on the first and second auxiliary lines to cover the auxiliary lines and in an emission area except the emission zones:

the organic light emitting and a cathode disposed in the emission area of the substrate, wherein an area of the top surface of the conductive layer is larger than that of a top surface of the organic light emitting layer; and a metal film disposed in the emission area of the substrate.

15. The apparatus of claim 14, wherein the conductive layer comprises a first conductive layer disposed in the emission area and a first pad area at the substrate, and a second conductive layer disposed in a second pad area at the substrate, and wherein the first conductive layer is insulated from the second conductive layer.

16. The apparatus of claim 15, further comprising a first auxiliary pad electrode disposed in the first pad area and a second auxiliary pad electrode disposed in the second pad area, wherein the first pad electrode and the second pad electrode are disposed in a same layer and made of a same material as the auxiliary lines.

17. The apparatus of claim 16, further comprising a first pad electrode disposed in the first pad area and a second pad electrode disposed in the second pad area, wherein the first pad electrode and the second pad electrode are disposed in a same layer and made of a same material as the plurality of anodes.

* * * * *